United States Patent
Minagawa

(10) Patent No.: US 9,391,635 B2
(45) Date of Patent: Jul. 12, 2016

(54) BLOCK SCANNER AND RUN-LEVEL ENCODER FROM AC TO DC VALUES

(75) Inventor: Yusuke Minagawa, Tsukubamiraishi (JP)

(73) Assignee: Texas Instruments Incorporated, Dallas, TX (US)

( * ) Notice: Subject to any disclaimer, the term of this patent is extended or adjusted under 35 U.S.C. 154(b) by 1183 days.

(21) Appl. No.: 12/776,496

(22) Filed: May 10, 2010

(65) Prior Publication Data

US 2010/0290533 A1    Nov. 18, 2010

Related U.S. Application Data

(60) Provisional application No. 61/178,726, filed on May 15, 2009.

(51) Int. Cl.
  *H03M 7/40*    (2006.01)
  *H03M 7/46*    (2006.01)

(52) U.S. Cl.
  CPC *H03M 7/40* (2013.01); *H03M 7/46* (2013.01); *Y10T 29/413* (2015.01)

(58) Field of Classification Search
  CPC ......... H03M 7/40; H03M 7/46; Y10T 29/413
  USPC ...................................... 375/240.23
  See application file for complete search history.

(56) References Cited

U.S. PATENT DOCUMENTS

| | | | |
|---|---|---|---|
| 6,546,145 B1 * | 4/2003 | Miyake et al. ............... | 382/248 |
| 7,532,765 B2 | 5/2009 | Dwyer et al. | |
| 2003/0235251 A1 * | 12/2003 | Hsiun et al. .................. | 375/245 |
| 2004/0062313 A1 * | 4/2004 | Schoenblum ............. | 375/240.25 |
| 2005/0135691 A1 | 6/2005 | Reese | |
| 2005/0249290 A1 * | 11/2005 | Gordon et al. ............ | 375/240.18 |
| 2007/0177664 A1 | 8/2007 | Lee | |
| 2007/0223579 A1 * | 9/2007 | Bao ............................ | 375/240.12 |
| 2008/0307240 A1 | 12/2008 | Dahan et al. | |
| 2010/0007533 A1 | 1/2010 | Xiao et al. | |
| 2010/0061457 A1 * | 3/2010 | Miyagi ..................... | 375/240.16 |
| 2010/0067810 A1 | 3/2010 | Kishi | |
| 2010/0074329 A1 | 3/2010 | Fu et al. | |

OTHER PUBLICATIONS

B. Lei et al. Optimization and Implementation of AVS-M Decoder on ARM. Fourth Int'l Congress on Image and Graphics. IEEE Computer Soc., 2007, pp. 255-258. Fig. 1, Table 1.

* cited by examiner

*Primary Examiner* — Anner Holder
(74) *Attorney, Agent, or Firm* — Lawrence J. Bassuk; Frank D. Cimino

(57) ABSTRACT

A block encode circuit (800) including a scanner (820) operable to scan a block having data values spaced apart in the block by run-lengths to produce a succession of pairs of values of Level and Run representing each data value and run-length, and wherein the Level values include one or more AC values succeeded by a DC value in the succession, and a Run-Level encoder (830) responsive to said scanner (820) to encode the values of Level and Run in a same AC to DC order as in the succession of pairs of values from said scanner (820) to deliver an encoded output. Other encoders, decoders, codecs and systems and processes for their operation and manufacture are disclosed.

8 Claims, 18 Drawing Sheets

BLOCK SCANNER AND RUN-LEVEL ENCODER FROM AC TO DC VALUES

CROSS-REFERENCES TO RELATED APPLICATIONS

This application is related to provisional U.S. Patent Application "Fast Residual Encoder In Video Codec" Ser. No. 61/178,726, filed May 15, 2009, for which priority is claimed under 35 U.S.C. 119(e) and all other applicable law, and which is incorporated herein by reference in its entirety.

STATEMENT REGARDING FEDERALLY SPONSORED RESEARCH OR DEVELOPMENT

Not applicable.

COPYRIGHT NOTIFICATION

Portions of this patent application contain materials that are subject to copyright protection. The copyright owner has no objection to the facsimile reproduction by anyone of the patent document, or the patent disclosure, as it appears in the United States Patent and Trademark Office, but otherwise reserves all copyright rights whatsoever.

BACKGROUND

Fields of technology are Telecommunications, Digital Signal Processing and Compression and Decompression of Image Data.

Structures and processes are provided for encoding and decoding a residual layer of advanced video codec standards such as AVS. An AVS residual encoder is a Chinese video codec standard. In conventional AVS, the order of scan and entropy coding are opposite to each other.

A block diagram of a residual encoder for a video codec is depicted in FIG. 1. A unit size of encoding and decoding a residual layer is called a block as illustrated by block 110 in FIG. 1. Residual coefficients in a Macroblock have zero value (Run) or non-zero value (Level). In some video codec standards, residual coefficients are compressed into a bitstream by the following steps:

(1) Encoder starts scanning 120 residual coefficients in a block 110 of quantized coefficients starting from the DC coefficient and scanning toward AC coefficients. The term "DC coefficient" refers to the single image transform coefficient representing the unvarying component or term in an image transform resulting from electronic computation, and often this term represents the average image intensity of the image to which the image transform is applied. AC coefficients refer to any or all of the image transform coefficients that represent the amplitude or intensity of each spatially varying component or term of the image transform of an image.

(2) During scanning, the encoder counts a number of consecutive Runs between Levels (called a Scan section in following FIG. 1).

(3) If the encoder finds Level, the Level value and number of consecutive Runs (Run-length) are converted into a symbol value. In this step, a conversion table based on Huffman coding theory is applied (called an Entropy Encoder 130 in following FIG. 1).

(4) The symbol value is converted into a bitstream and fed to a stream buffer 140.

In FIG. 2, blocks and a Macroblock and their relationship are illustrated, showing blocks inside a Macroblock. A block has 64 coefficients (8 for horizontal, and 8 for vertical), and a Macroblock has 6 blocks (4 blocks are luminance and 2 blocks are chrominance) in a 4:2:0 format. Then, 64 coefficients/block×6 block/Macroblock=384 coefficients/Macroblock.

Clock cycles for encoding or decoding a Macroblock are distributed among tasks for encoding or decoding a Macroblock in three categories. The first task category is interface control to prepare information for a current Macroblock and a neighbored Macroblock and accomplish data transactions at system level. It can consume around 50 clocks clock. Second is a Macroblock header process that generates a motion vector predictor, and processes syntaxes in the Macroblock header such as electronic computation of motion vector, Macroblock type, CBP (Coded Block Pattern read: on/off bit), and quantization parameters and can consume around 300 clocks. Third is a residual layer process that processes 384 coefficients in each Macroblock and can be quite time consuming beyond available real-time processing budget.

As described hereinabove for FIG. 1, encoding the residual layer starts with scanning coefficients in a block. In order to start entropy coding of a block, all coefficients in the block are scanned to get the Level value and Run-length. A rule or order for scanning coefficients is illustrated in FIG. 3. Thus, FIG. 3 depicts a scanning order of residual coefficients in a block. The method in FIG. 3 is called a Zig-Zag Scan. The Level value and Run-length are integrated into one word, and encoded into a bit-stream according to a particular rule or order adopted for the entropy coding.

In an AVS residual encoder processing flow, the order of scan and entropy coding are opposite to each other according to a method for encoding the residual layer as illustrated in the following FIG. 4.

In conventional AVS encoding, the encoder scans the residual coefficients in a block from DC to AC. This method is called a Zig-Zag scan. The encoder checks non-zero coefficients and number of consecutive zero coefficients before the non-zero coefficient. Here, the non-zero coefficient is called a Level, and number of consecutive zero coefficients is called a Run. When the encoder faces to or encounters a Level, the Level and Run are stored into a buffer memory as in FIG. 4. The reason why the encoder needs to store the Level and the Run is that the entropy coding order (AC-to-DC) is opposite to the DC-to-AC scanning order, which is recognized herein as problematic and emphasized herein by oppositely-directed vertical arrows of FIG. 4. Put another way, the order of scan that constitutes the Run & Level Buffer in FIG. 4 is opposite to the order by which the entropy coder consumes the contents of that Run & Level Buffer. The entropy encoder starts encoding from the last entry of the Run & Level buffer as shown in FIG. 4.

As illustrated in FIGS. 4 and 5, the processing flow of an AVS residual encoder has steps wherein (1) The encoder starts scanning all coefficients inside a block from DC position to AC ($64^{th}$) position.

(2) The encoder stores Level and Run-length before the Level when the encoder finds a Level during scanning (3) After the encoder has finished scanning all coefficients in the block, the encoder starts entropy coding of the block from the last Level toward the first Level. In FIG. 4, ID=13 (Level=1, Run=2) is firstly encoded. Then ID=12, ID=11 ... and finally ID=0 (Level=18, Run=0) is encoded.

In a first time slot of FIG. 5, the encoder scans block-0 and does not activate entropy coding. In a second slot, the encoder of FIGS. 3A/3B and FIG. 4 scans block-1 and activates entropy coding of block-0, per step (3) of the previous paragraph. Consequently, the encoding pipeline latency is equal to the time period consumed by scanning the previous block. In an AVS residual encoder, the pipeline latency is equal to 64 clocks without any overhead. A functional image of this pipelined architecture is illustrated in FIG. 5 and shows the pipeline latency of AVS.

In order to accomplish the encode in H/W, a ping-pong buffer 335 is provided in FIG. 6. The encoder stores Level and Run-length, as illustrated in FIG. 4, in the ping-pong buffer 335 of FIG. 6. A block diagram of the encoder with two ping-pong buffers 335.1 for parallelized data transfer in and 335.0 for data transfer out is illustrated in FIG. 6. Each buffer 335.0 and 335.1 is capable of storing 64 coefficients. Because maximum Run-length is 63 (defined by 6 bits), each buffer has a capacity of at least 1408 bits, wherein 64 coefficients times the sum of 16 bits/coefficient (Level) plus 6 bits/coefficient (Run) is 1408 bits. Total ping-pong buffer size for the parallelized operation of FIG. 6 is therefore 2 buffers times 1408 bits/buffer, or a total of 2816 bits. Thus, almost 3 Kbits of memory area is involved to do AVS in the way just described.

Existence of buffer memory and pipeline latency are problematic and disadvantageous from the standpoints of performance, power and area. A buffer memory of 3 Kbit consumes electric power, and respective control logic must also be provided for each buffer. As illustrated in FIG. 5, processing time is equal to that of encoding 7 blocks.

Note in FIG. 4 that the scanning order and coding order of residual layer are opposite to each other. In this conventional approach, the encoder firstly scans coefficients in block-0 and results are stored into a buffer-A 210 in the Buffer Area 335.1 of FIG. 6. After the encoder finishes scanning (320) into the block-0, the encoder starts scanning (320) into block-1 (335.1) and does entropy coding (330) of block-0 (335.0) that was stored in buffer-A. The result of scanning block-1 is stored in buffer-B in the Buffer Area of FIG. 6. Scan 320 sends Encoder core 330 number of level coefficients per each block and a CBP value of the block. In this manner, all blocks from block-0 to block-5 in a Macroblock are encoded in FIG. 5. Thus, a pair of space-consuming buffers not only expend chip real estate but also introduce a pipeline latency of 1 block—a pipeline latency of e.g., 70 clocks and keeping encode total clock cycles unacceptably high.

Accordingly, some ways of providing improved encoders and decoders, processes and systems would be very desirable in the art.

SUMMARY OF THE INVENTION

Generally, one form of the invention includes a block encode circuit including a scanner operable to scan a block having data values spaced apart in the block by run-lengths to produce a succession of pairs of values of Level and Run representing each data value and run-length, and wherein the Level values include one or more AC values succeeded by a DC value in the succession, and a Run-Level encoder responsive to the scanner to code the values of Level and Run in a same AC to DC order as in the succession of pairs of values from the scanner to deliver an encoded output.

Generally, one manufacturing process form of the invention includes fabricating on a single integrated circuit chip a block buffer and a scanner operable to scan the block buffer for data values spaced apart in the block by run-lengths to produce a succession of pairs of values of Level and Run representing each data value and run-length, and wherein the Level values include one or more AC values succeeded by a DC value in the succession, and a Run-Level encoder responsive to the scanner to code the values of Level and Run in a same AC to DC order to deliver an encoded output.

Generally, an image encoder process of the invention includes electronically scanning image transform-based coefficients in a particular scanning order and variable-length coding the image transform-based coefficients in substantially the same order.

Generally, a reduced-memory encoder of the invention includes an encoder operable to encode a series of data input thereto, the encode dependent on coding information in a plurality of different coding tables; a re-usable store space for the plurality of different coding tables for encoder support, the same store space otherwise re-usable for other uses than encoder support; a coding memory space able only to hold substantially fewer than the plurality of coding tables, the encoder coupled to access only the coding memory space instead of the re-usable store space for coding table information; and a selection circuit operable to supply a selection signal to the store to deliver an applicable coding table to the coding memory space.

Generally, another manufacturing process of the invention includes fabricating on a single integrated circuit chip a code-related processing circuit dependent on coding information in a plurality of different coding tables to encode a series of data input thereto, a cache memory having a capacity sufficient to hold the different coding tables, a coding memory space substantially smaller than the cache memory, the code-related processing circuit coupled to access only the coding memory space instead of the cache memory for such coding information, and a selection circuit operable to supply a selection signal to the cache memory to deliver an applicable coding table to the coding memory space.

Generally, a decode circuit of the invention includes a Run-Level decoder operable to deliver a succession of pairs of values, each pair including a Run value and a Level value, and an inverse scanner responsive to the succession of pairs of values to populate a block with the Level values including one or more AC values and a DC value, the Level values spaced apart in the block by runs having lengths represented by the Run values, and the inverse-scanner is operable to sequentially populate the block using the Level values and the Run values in a same AC to DC order as in the succession of pairs of values from the Run-Level decoder.

Generally, a decoding process of the invention includes variable-length decoding according to a decoding order to supply image transform-based coefficients and Run values; and inverse-scanning the coefficients using the Run values into a block in substantially the same order as the decoding order.

Generally, a reduced-memory decoder of the invention includes a decoder operable to decode a series of data input thereto, the decode dependent on coding information in a plurality of different coding tables, a re-usable store space for the plurality of different coding tables for decoder support, the same store space otherwise re-usable for other uses than decoder support, a decoding memory space able only to hold substantially fewer than the plurality of coding tables, the decoder coupled to access only the decoding memory space instead of the re-usable store space for coding table information; and a selection circuit operable to supply a selection signal to the store to deliver an applicable coding table to the decoding memory space.

Generally, an electronic system of the invention includes a modem operable to receive a transmission, a Run-Level decoder responsive to the transmission to deliver a succession of pairs of values, each pair including a Run value and a Level value; an inverse scanner responsive to the succession of pairs of values to populate a block with the Level values including one or more AC values and a DC value, the Level values spaced apart in the block by runs having lengths represented by the Run values, and the inverse-scanner operable to sequentially populate the block using the Level values and the Run values in a same order as in the succession of pairs of values from the Run-Level decoder; and a display circuit operable in response to the inverse scanner to form an image signal.

Other encoders, decoders, codecs and systems and processes for their operation and manufacture are disclosed and claimed.

Corresponding numerals in different Figures indicate corresponding parts except where the context indicates otherwise. A minor variation in capitalization or punctuation for the same thing does not necessarily indicate a different thing. A suffix .i or .j refers to any of several numerically suffixed elements having the same prefix.

DETAILED DESCRIPTION OF EMBODIMENTS

Removal of these hereinabove-described impediments, problems, and expense items confers a big improvement herein.

One type of embodiment herein scans residual coefficients in the same order as entropy coding in such standards, and is implemented into an image and video (IVA) AVS (Chinese standard) high definition (HD) ECD (Entropy Coder and Decoder) core and provides reduced logic size, memory size and improvement of performance. Various embodiments herein are applicable to AVS, H.264 and any other imaging/video encode and/or decode processes to which the embodiments can similarly benefit, and various parts of the description using the term AVS herein also implicitly relate to H.264 and any other similar image/video processing. Such type of solution is highly beneficial for less chip real estate expense in H/W implementation, especially in system which is driven at Macroblock level such as in an IVA-HD embodiment.

Figure 6:
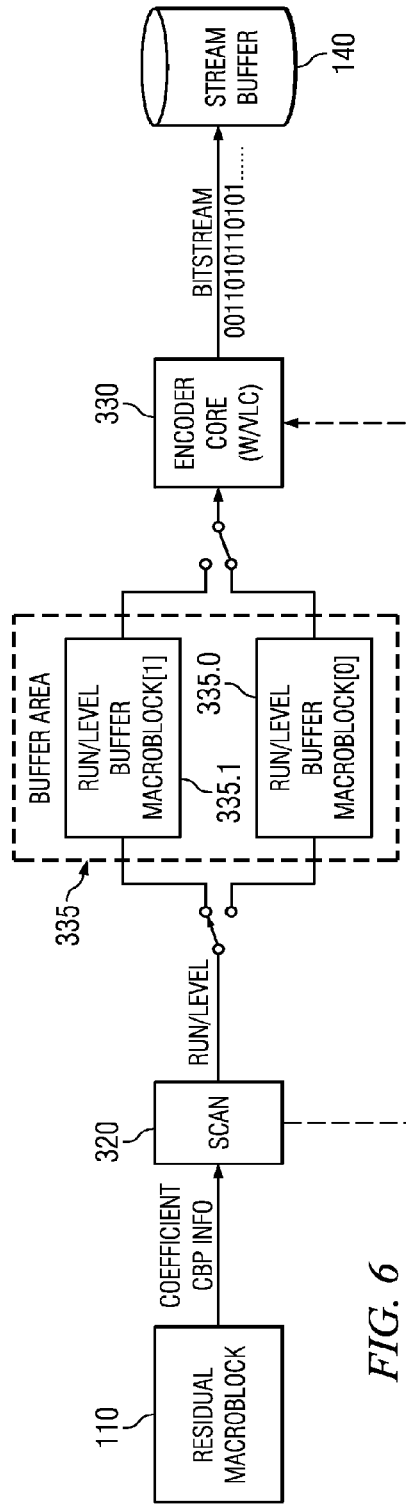
FIG. 6 is a block diagram of an electronic circuit having a ping-pong buffer to provide enough space for accommodating the operations of FIGS. 5 and 4.
Figures 7A, 7B:
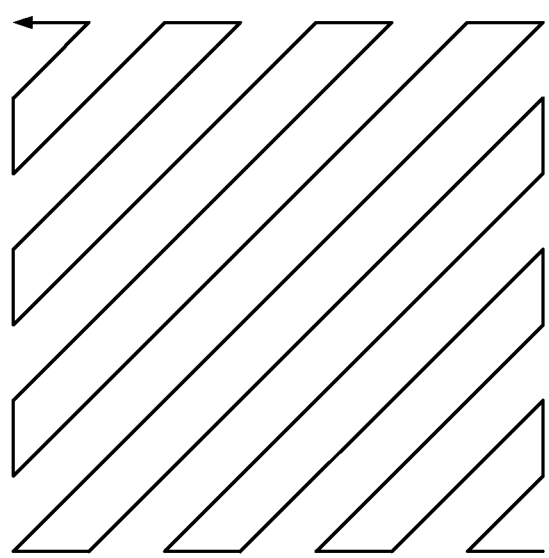
FIG. 7A is a diagram of an inventive process of AC-to-DC scan of a block.
FIG. 7B is a line diagram of an inventive reversed zig-zag scanning order in the FIG. 7A AC-to-DC scan of a block.

In order to solve the problems, some embodiments of structure and process or method encode residual coefficients without buffer memory outside of encoder core and without pipeline latency. In hardware (H/W), the encoder desirably should execute scanning and entropy coding simultaneously with pipelined architecture. The encoder establishes the order of scan to be same as the order of entropy coding within a block 510. Notwithstanding that run length in AVS residual encoding is in the direction of DC-to-AC, the remarkable scanning order of the encoder embodiment of FIGS. 7A, 7B, 7C herein is reversed so that the scan order and entropy coding order are in the same direction as indicated by AC-to-DC directed arrows of FIG. 7C. Thus, the scanning order of scan 520 is in the index-downward (63-to-0, drawing-upward large arrow in FIG. 7A) direction of AC coefficients toward the DC coefficient, such that AC→DC. So, compared to the conventional process of FIG. 4, the encoder embodiment of FIGS. 7A, 7B, 7C defines a reversed order of scanning (from AC to DC) as illustrated in FIGS. 7A and 7B. Because the entropy encoder 530 of the embodiment of FIG. 7C consumes the Run and Level data in the same AC-to-DC order as the scan block 520 produces that Run and Level data, little or no pipeline latency results and the Run & Level Buffer 210 of FIG. 4 and 335 of FIG. 6 is beneficially dispensed with.

In FIG. 7A, the direction of scanning in a block of the residual data is illustrated. In FIG. 7B, a trace of scanning or visualization of scanning order is illustrated. This remarkable encoder 500 starts scanning from the AC coefficient numbered as 63, and then 62, 61, 60 . . . and finishes scanning at the DC coefficient numbered as 00. Because the order of scanning and the entropy coding are made to be the same as each other in this embodiment, there is no need to store all Levels and Run-length into a buffer memory like that of FIG. 4.

Figure 7C:
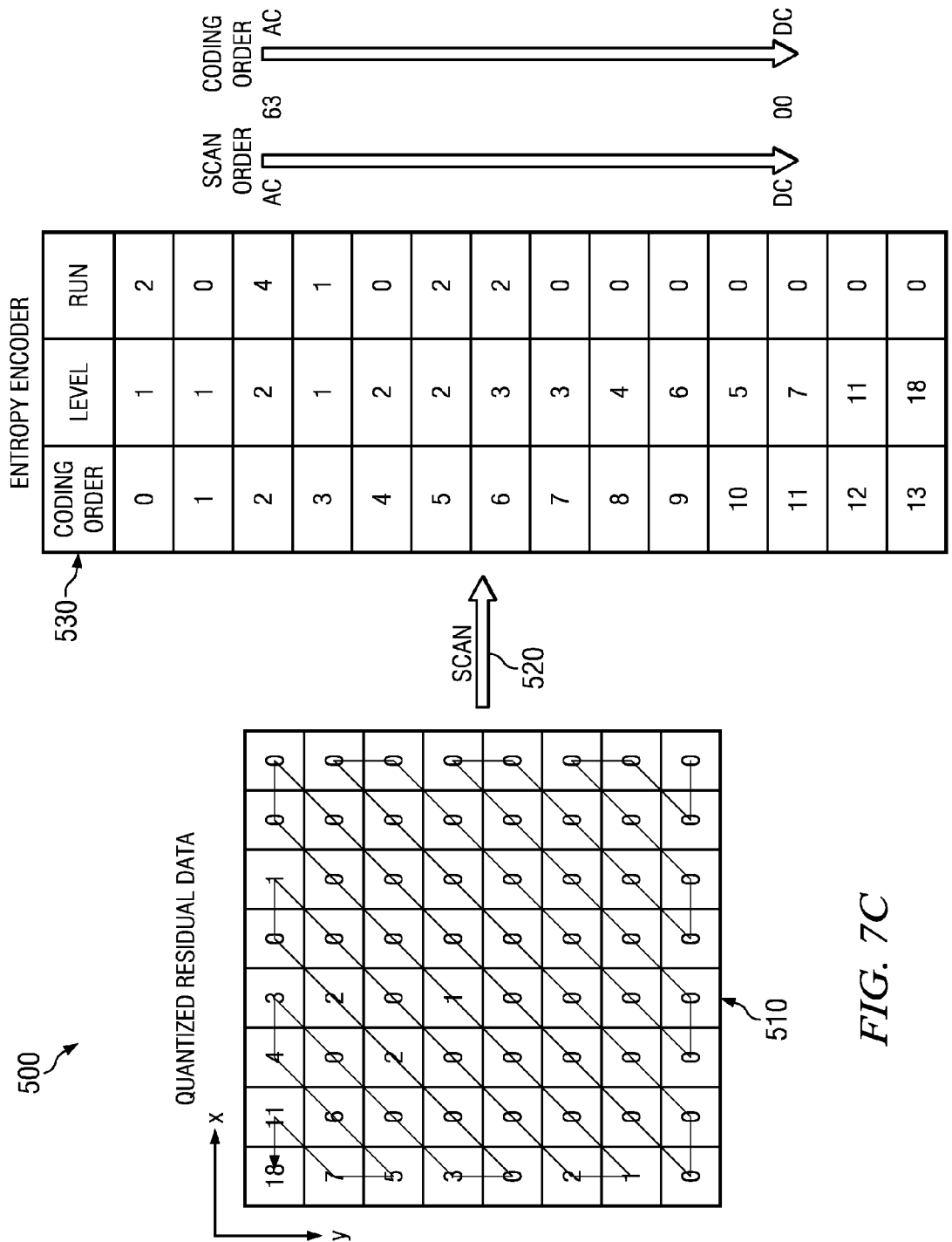
FIG. 7C is a partially block-tabular, partially flow, diagram of inventive process and structure showing a block of quantized residual data being scanned directly and unbuffered into a Run & Level encoder in a scan order aligned AC-to-DC with a coding order of the encoder.

Notice that conventional AVS Run-length has direction of DC→AC, which is the opposite order to the direction of scanning of the embodiment of FIGS. 7A, 7B, 7C. So, in this embodiment a register called the Level register is prepared or provided, to which register a Level is stored. Storing a Level to this Level register introduces a coefficient-level pipeline latency, but such coefficient-level pipeline latency is negligible compared to the FIG. 5 block-level pipeline latency that is eliminated.

In FIG. 7C, the residual encoder embodiment starts scanning coefficients from AC to DC. When the encoder encounters or faces the first Level coefficient (in this example, it is the "1" of FIG. 7C in cell 24 of FIG. 7A) then a Run counter 528 of FIG. 8B, provided for monitoring, checking for, and counting consecutive zero coefficients in the residual data, is activated and the Level coefficient is registered in the Level register 526. Thus, the Run-length is scanned in reverse compared to conventional AVS scan. After that, when the encoder encounters or faces a next Level coefficient, the encoder sends the already-registered Level coefficient and the latest Run counter value representing the Run-length to the entropy encoder 530, and resets the Run counter 528. Run counter 528 is reset when encoder faces level coefficient during scanning from AC to DC. See also the description of waveforms in FIG. 8A. This process embodiment does not need any buffer memory to store all values of Level and Run-length in a block as result of scanning. Accordingly, the embodiment of FIG. 7C omits and removes such buffer memory and beneficially eliminates about 70 clocks of latency per block.

Thus, scanning or checking of the coefficients from AC to DC (e.g., 63-to-zero) to make order of scanning be the same as the order of entropy coding, solves issues and problems faced hitherto. All the ping-pong buffer memory (e.g., 3 Kbit) is or can be removed, conferring a reduction of power and area. Control logic for buffer memory is also removed (e.g., 4 Kgate which may amount to 5% reduction). Pipeline latency is reduced by, e.g., 70 clocks or over 8% of Macroblock time budget). Scanning residual coefficient of a block starts from lowest-right AC coefficient in FIG. 7C and ends with highest-left coefficient, which is the DC coefficient.

Figure 8A:
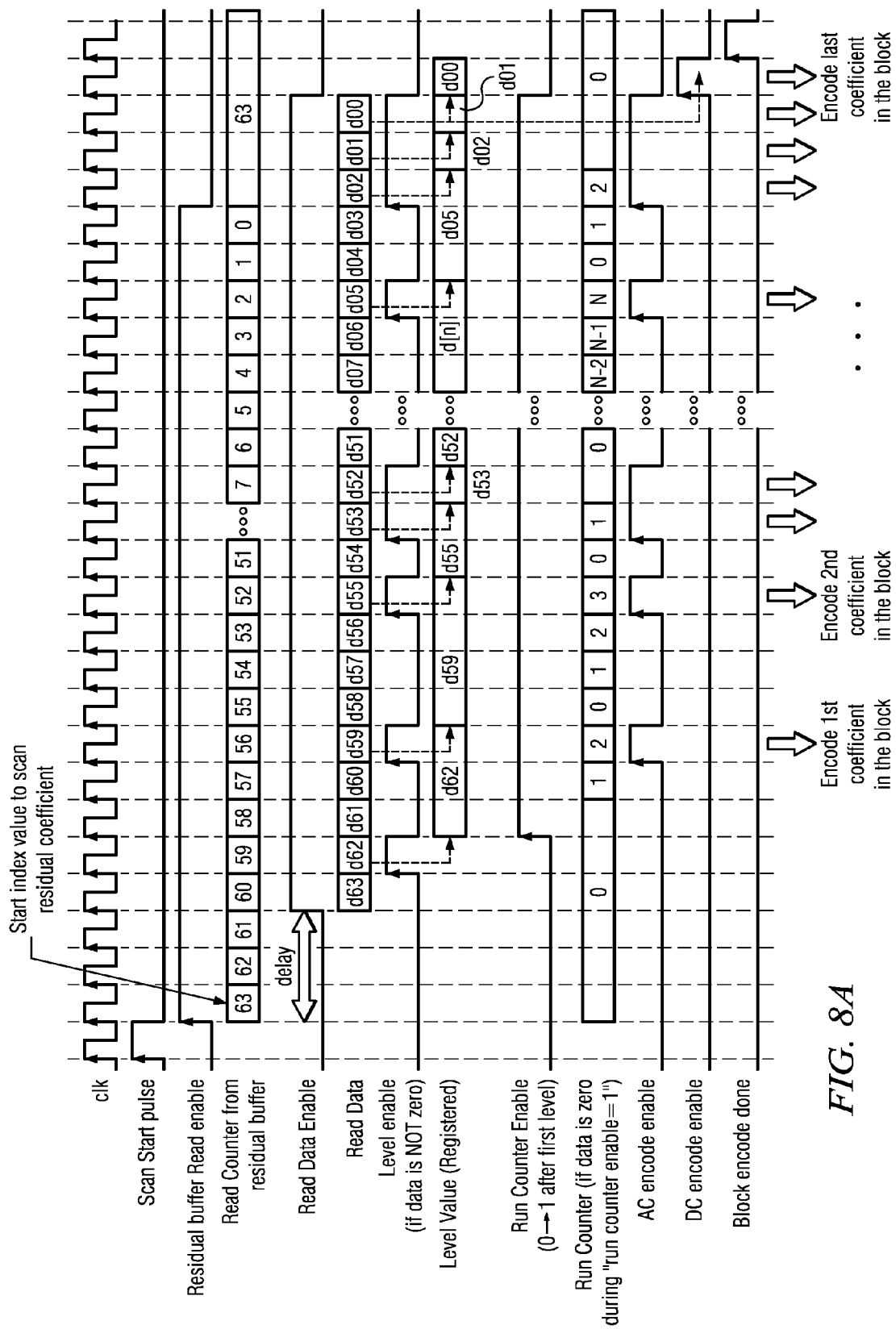
FIG. 8A is a signal timing diagram for an inventive process detailing scan and encode control operations for the process and structure of FIGS. 7A and 7B and obviating block delay or latency.
Figure 8B:
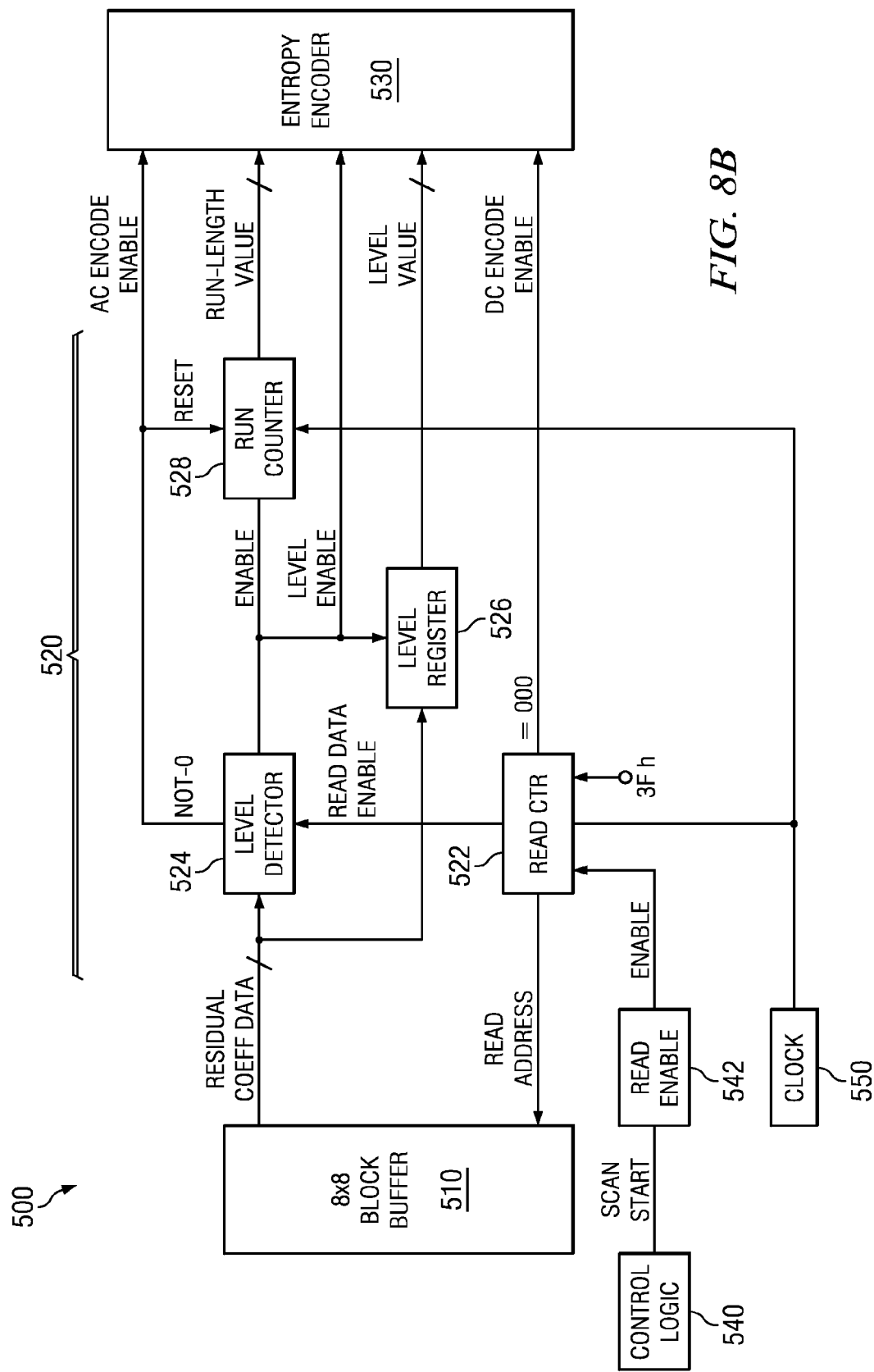
FIG. 8B is a block diagram of an inventive electronic circuit for operating according to the inventive process of FIG. 8A.

As illustrated in FIGS. 8A and 8B, such an embodiment of or in an IVA-HD processor (FIG. 14) has waveforms of signals and operations to accomplish AVS residual encoding in a residual encoder embodiment. The residual encoder starts reading residual coefficients in response to a pulse signal named Scan Start from a control logic 540 in FIGS. 8A and 8B and by Read Enable logic 542 thereupon asserting a Read Enable on the next clock. A Read Counter 522 thus enabled starts counting to vary its count index value indicated by the Read Counter 522 to scan a residual buffer 510 holding a block of the residual coefficients from 63 down to zero. After an acceptable access delay of a few clocks (three clocks shown), a Read Data Enable line is asserted and a series of clock-by-clock Read Data d63, d62, . . . d0 enter a Level Detector. Some encoder embodiments initially run the Run counter in response to the Read Data Enable and before the first Level coefficient is encountered, and then send an initial Run count to the decoder, and an analogous decoder uses that initial Run count and positions the received first Level coefficient at its corresponding inverse-scan position.

The Level Detector 524 determines whether each Read datum is NOT zero, and if a not-zero instance occurs, then a Level enable pulse or signal line is asserted during a clock interval respective to each such not-zero instance. (Some not-zero instances are consecutive in FIG. 8A, and the Level enable is correspondingly extended in duration to encompass them.) Each such Level value from the Read data is registered to the Level register 526 as indicated by Level value (Registered) illustration with d62, d59, d55, d53, d52, . . . d[n], d05, d02, d01, d00. (Notice that this series of Level data represents a data example different from the example in FIGS. 4 and 7C, merely to simplify FIG. 8A and elucidate the process.)

When the encoder 500 encounters or faces the first Level coefficient, the Level Detector 524 registers the Level value in Level register 526, asserts Run Counter Enable (0-to-1 after first Level coefficient) and starts incrementing a Run Counter 528 to count up a Run length value. Run Counter 528 increments on each clock if and so long as each successive residual coefficient datum is zero during "run counter enable=1" in FIG. 8A, i.e. during the asserted state of the Run Counter Enable.

If and when the encoder faces the second Level coefficient or a subsequent Level coefficient, a signal AC Encode Enable is asserted from the Level Detector 524 circuit with duration same as corresponding duration of asserted signal Level Enable, and the registered Level value of the first coefficient and Run counter value are encoded as residual encoder output, as indicated by a first vertical down arrow entitled "Encode 1st coefficient in the block." Several such vertical down-arrows are shown at bottom of FIG. 8A. Also, the second Level coefficient is registered (e.g. d59) in the Level register 526, and the Run Counter 528 in FIG. 8B is reset and starts incrementing. Run counter 528 is reset when encoder faces or encounters a Level coefficient during scanning from AC to DC.

The process repeats analogously for subsequent Level coefficients. When the DC coefficient d00 is read in as Read Data, the signal Level Enable and the signal Run Counter Enable are both de-asserted and go low, and in the same clock cycle a signal pulse DC Encode Enable is asserted high. The last coefficient d00 in the block is encoded, as indicated by the lower-rightmost down arrow in FIG. 8A, and a completion pulse Block Encode Done is issued by the residual encoder. In this way, a light and fast residual encoder embodiment with only one register is achieved and is light, for instance, in terms of real estate and power dissipation. Various alternative circuits can be prepared by the skilled worker informed by the teachings herein to accomplish substantially similar operations or results.

Figure 8C:
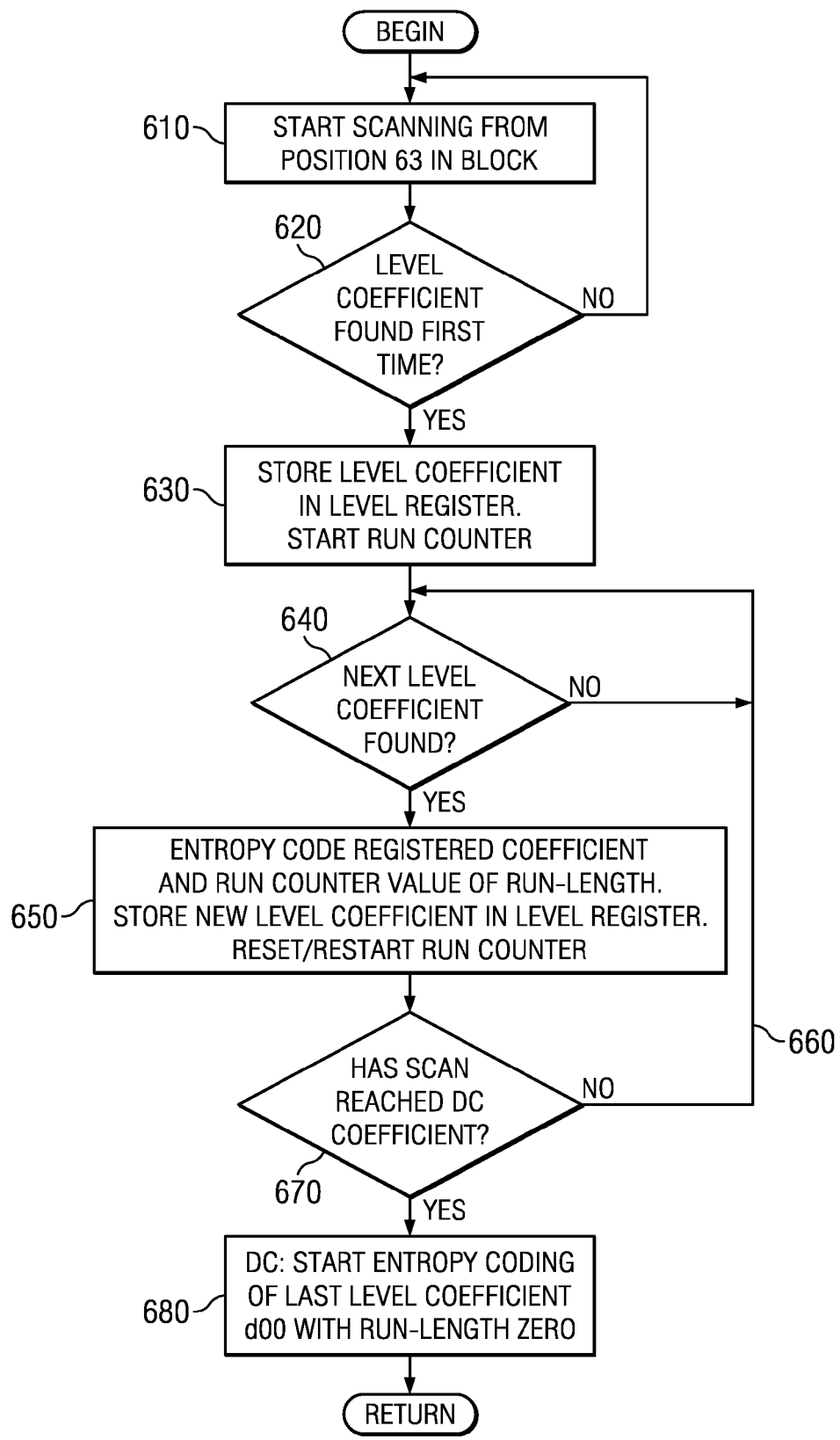
FIG. 8C is a flow diagram for an inventive process corresponding to the operations of FIG. 8A for the inventive electronic circuit of FIG. 8B.

A process embodiment of FIG. 8C for encoding is set forth in the following flow description of flow steps (1)-(5).
(1) Encoder step 610 starts scanning coefficients from bottom-right of a block (position=63 in FIG. 7).
(2) According to a decision step 620, when the encoder finds a Level coefficient for the first time from (1), the Level coefficient is stored, according to a step 630, in the Level register (in FIG. 8A, d62 is the first Level coefficient and is registered), and the Run counter 528 is started counting.
(3) According to a decision step 640, when the encoder finds a next Level coefficient d59 after (2), the encoder sends Level d62 and the value of Run counter to entropy encoder.

In a step 650, Entropy encoder starts entropy coding of the already-registered Level coefficient d62 and the Run counter value (equal to Run-length). The new Level coefficient d59 is then registered in the Level register, and the Run counter is reset to zero.

(4) In a step 660, the encoder repeats steps 640, 650, i.e. action of (3) until scanning position reaches DC coefficient position 00.

(5) According to a decision step 670, when the encoder reaches DC position, an additional one-clock pulse (DC Encode Enable) is asserted according to step 680 in order to start entropy coding of the last Level coefficient d00 with Run-length zero.

With this process embodiment, pipeline latency is small and equal to clock cycles of Run-length. In processing a residual layer of a Macroblock, each coefficient is processed within one (1) clock, i.e. single-clock per coefficient performance is delivered by this residual encoder embodiment in both of AVS encoder and decoder for residual layer. And such process embodiment of FIG. 7C needs no space-consuming buffer memory area of FIG. 6 to store Run-length and Level for a full one-block latency-wasting time interval of FIG. 5. Memory real estate is or can be removed and thus expense is saved or room for other uses is afforded. Access to such memory is obviated, so control logic for such memory is not provided and thus still more real estate economy is realized. This embodiment reduces cost, i.e. makes a low-cost contribution, and provides a lower-power H/W implementation of a residual encoder that can execute AVS.

A further beneficial impact eliminates certain space consuming tables. In an AVS residual encoder, an operation called CAVLC (context adaptive variable length coding) is applied to scanned Levels and Runs. The CAVLC of AVS has 19 tables: 7 tables for luma intra Macroblock, 7 tables for luma inter Macroblock and 5 tables for chroma Macroblock. For example, a VLC table is changed as context data is updated for each Level coefficient. The functional flow chart is illustrated in following FIG. 9, which shows a procedure of updating a VLC Table on an AVS residual encoder (inter Macroblock) improved as taught herein.

Figure 2:
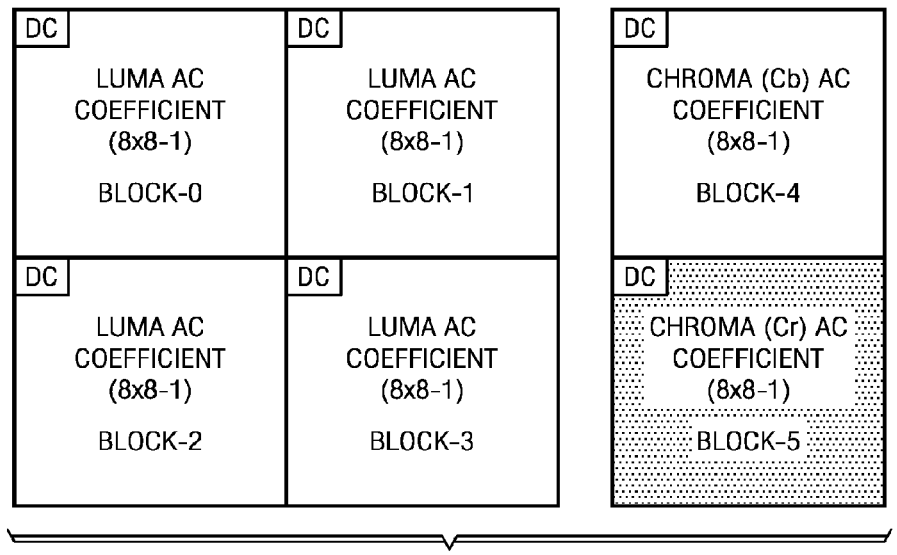
FIG. 2 is a diagram of a macroblock for a residual layer of image transform-based data and having 8×8 blocks for luma, blue chroma and red chroma.
Figure 9:
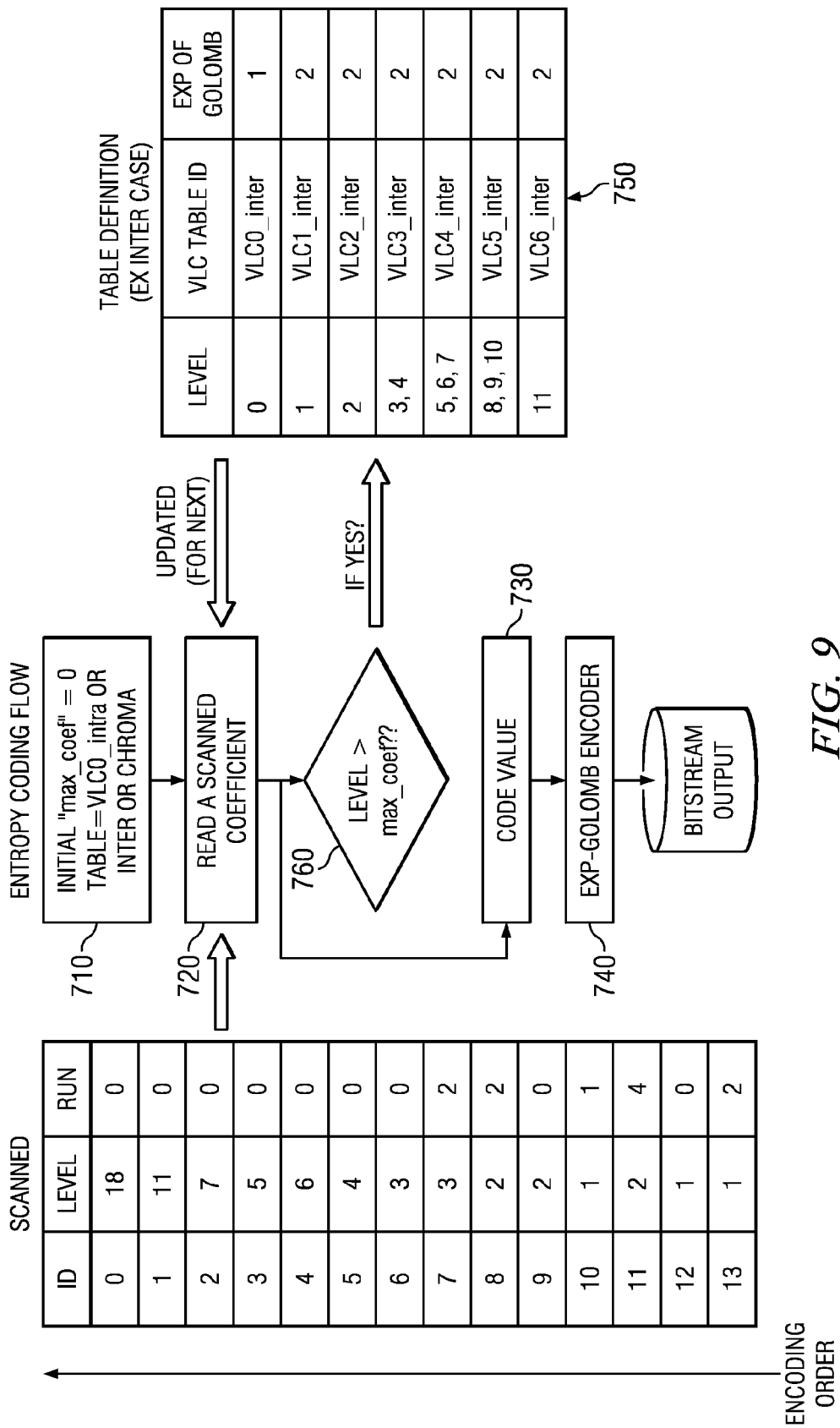
FIG. 9 is a partially block-tabular, partially flow, diagram of an inventive process for parallelizing and hiding coding table accesses with the inventive scan and control operations of FIGS. 7A-8C.

In FIG. 9, a specified maximum coefficient value or defined threshold called max_coef is pre-stored and corresponds to each VLC Table for use by the FIG. 9 process to select which VLC Table to apply. A detailed procedure is set forth in the following flow statement describing FIG. 9, assuming a FIG. 2 Macroblock of the Luma Inter type. In FIG. 9, the process selects which of the 7 Inter tables VLC<0-6>_inter to apply for entropy encoding a posited Luma Inter Macroblock.

Figure 4:
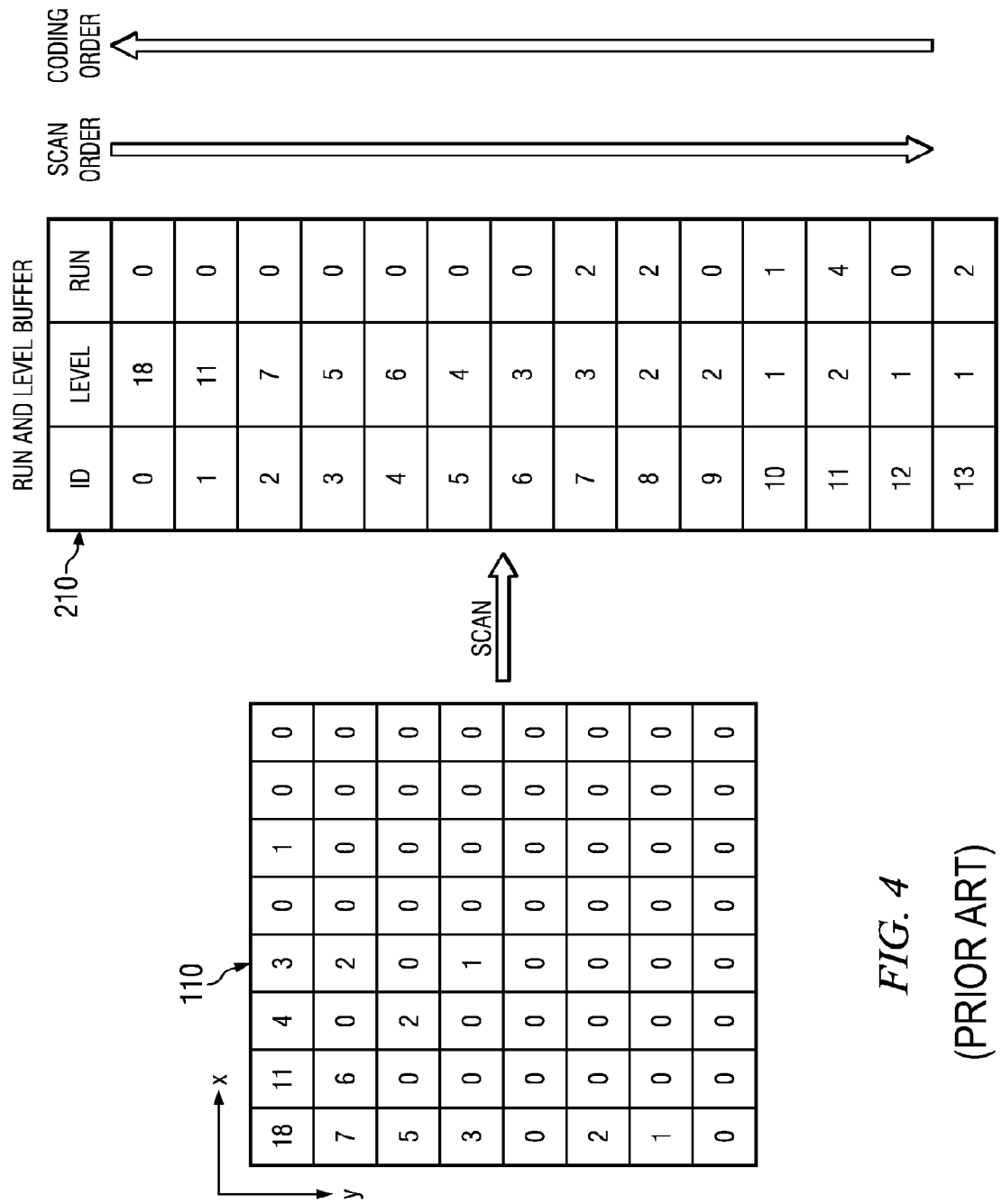
FIG. 4 is a partially block-tabular, partially flow, diagram of a block of quantized residual data being scanned into a Run & Level buffer in a scan order opposed to a coding order.

(1) Encoder starts reading Level/Run in AC-to-DC order starting from ID=13 in the Run & Level Buffer of FIGS. 4 and 9 or those same Level/Run values first-produced by now-reversed-scan in FIG. 7C. In a flow step 710, the value of max_coef is 0 at the beginning of encoding a block.

Figure 12A:
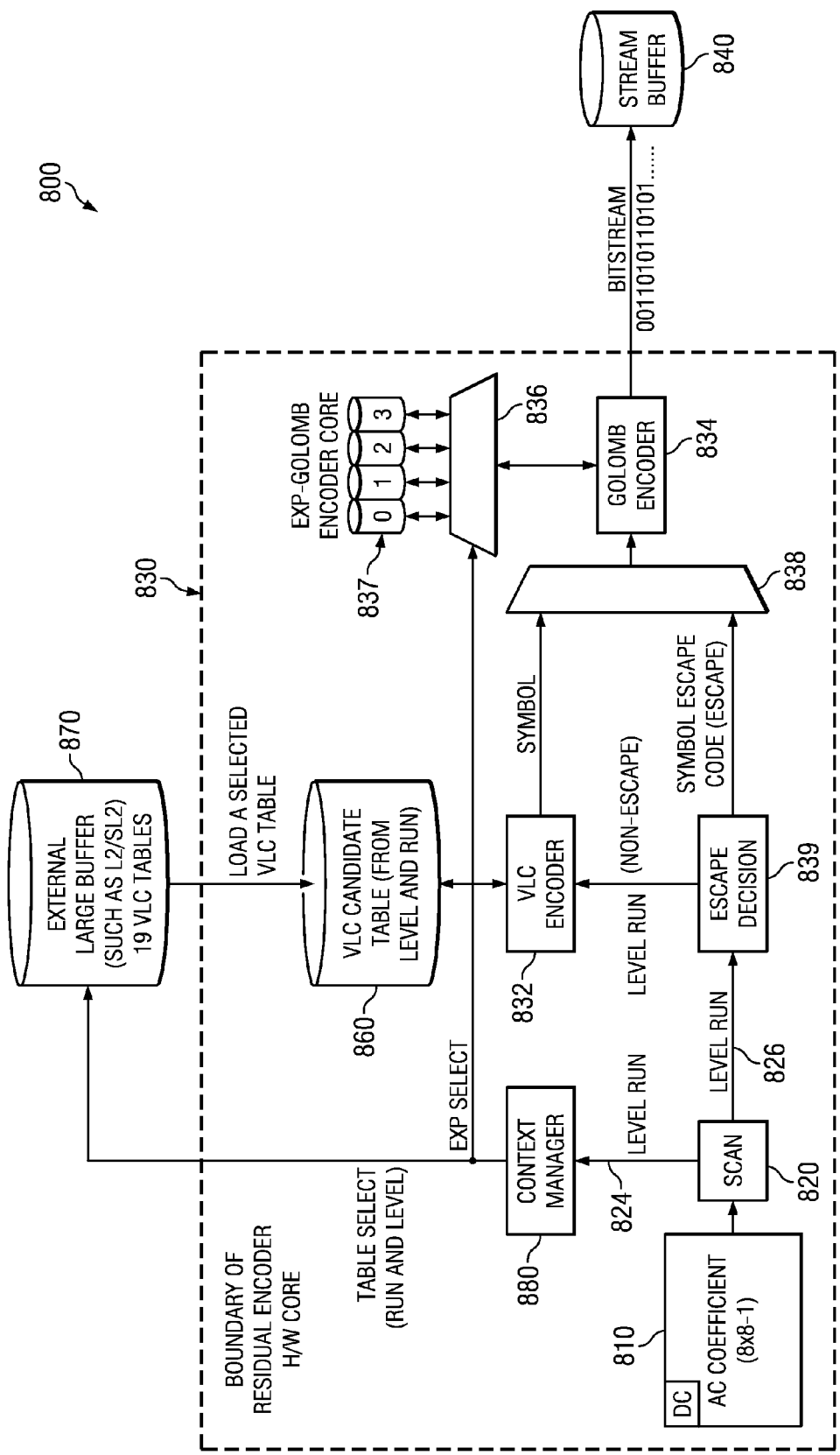
FIG. 12A is a detailed block diagram for an inventive hardware encoder core of FIG. 11A and accommodating the inventive process and structures of FIGS. 7A-9, and with inventive substantially-reduced memory space compared to FIG. 10A.
Figure 12B:
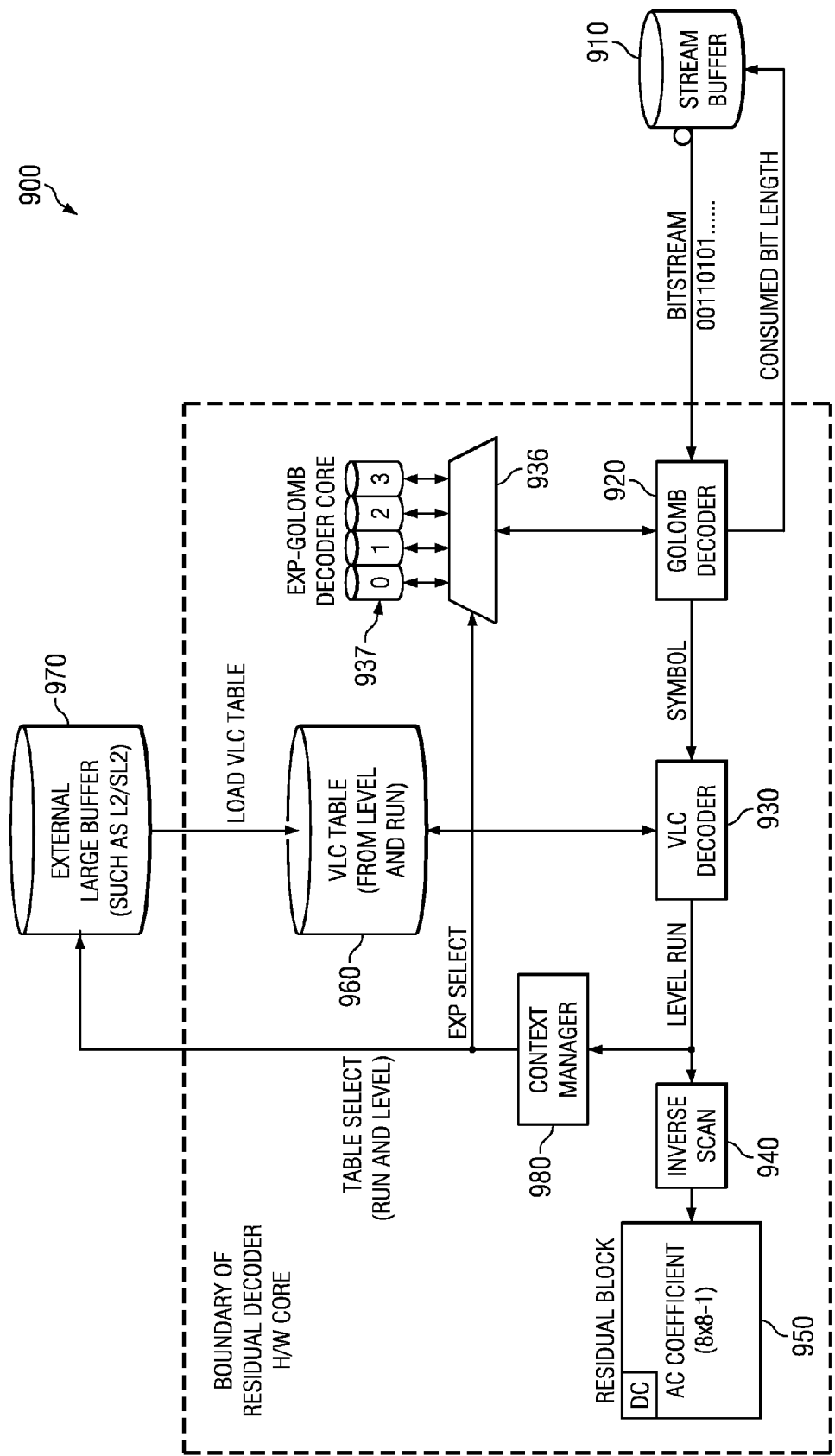
FIG. 12B is a detailed block diagram for an inventive hardware decoder core of FIG. 11B and accommodating inventive processes and structures analogous to those in FIG. 12A, and with inventive substantially-reduced memory space compared to FIG. 10B.
Figure 12C:
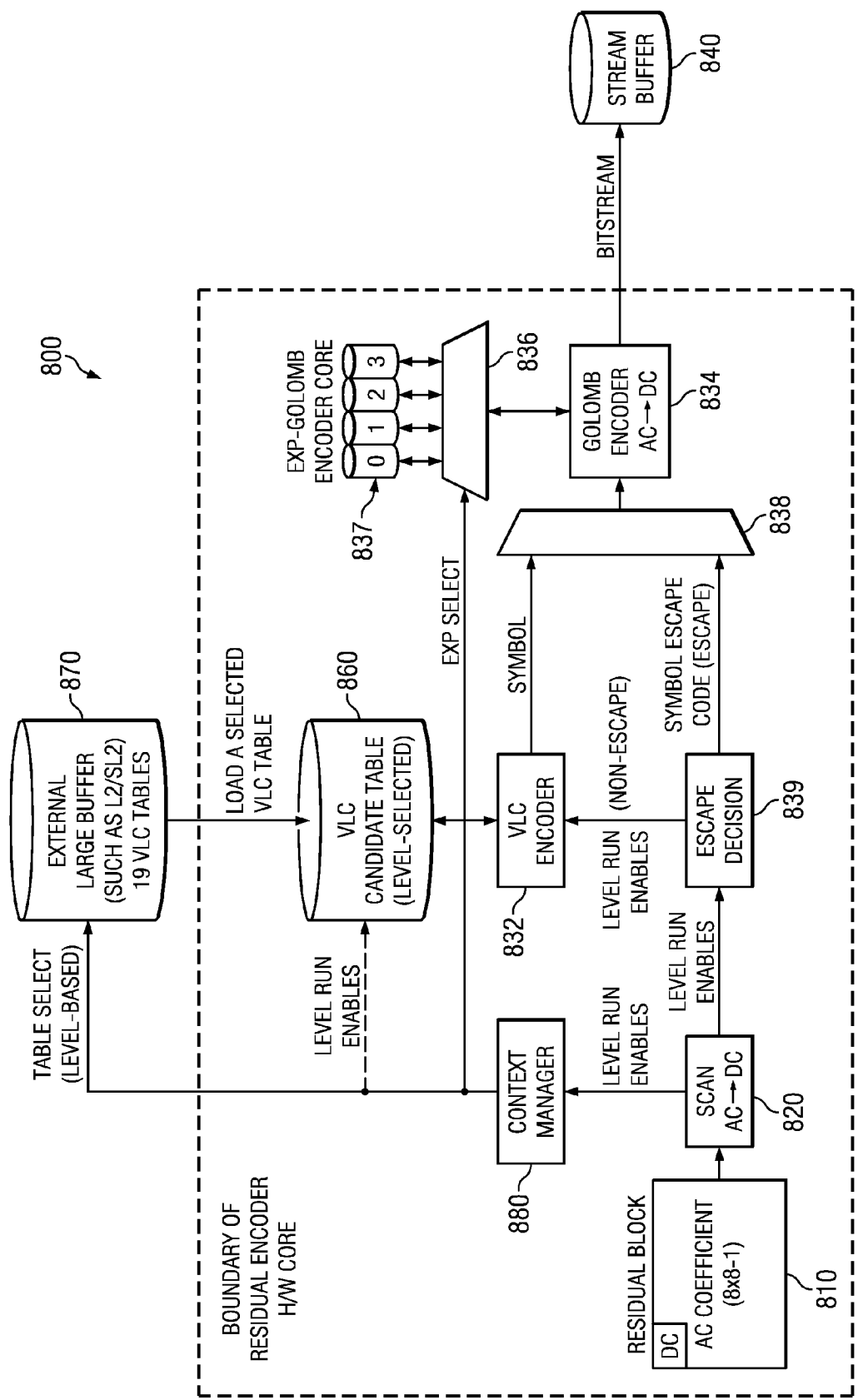
FIG. 12C is a further detailed block diagram for an inventive hardware encoder core like that of FIG. 12A.

(2) The encoder in a step 720 refers to VLC0_inter table, and gets a symbol value from that VLC table or a Code Value from the VLC coding table 750 for the FIG. 12A, 12C VLC Encoder to use in generating a symbol value according to a step 730.

(3) The symbol value is sent by step 740 to exp-golomb encoder (exp means exponential).

(4) In a decision step 760, the encoder evaluates whether the current Level value is larger than the specified max_coef value for the current VLC table or not. If not, the same VLC table is applied to next Level. Otherwise, the VLC table 750 selection is changed to a new one based on the Table definition illustrated at right in FIG. 9.

(5) The encoder (step 720) reads next Level, and then refers to the evaluated VLC table and gets symbol value by step 730.

(6) The encoder repeats (3), (4) and (5) until it reaches to the last Level in the block.

(7) The encoder asserts an EOB (end of block) code when it reaches the last Level in the block.

Figure 10A:
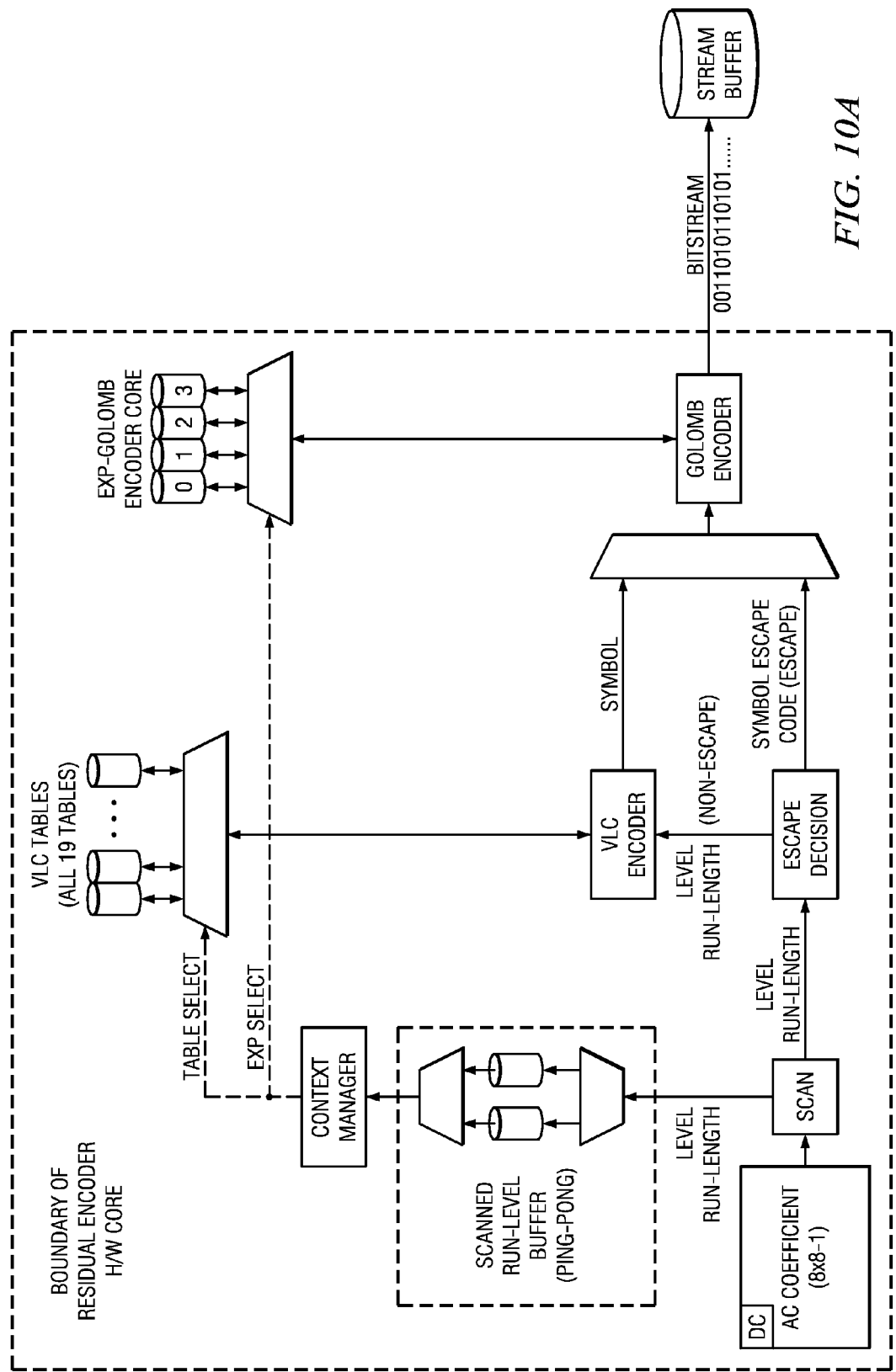
FIG. 10A is a block diagram of a hardware encoder core similar to that of FIG. 6 with conventional scan and ping-pong buffer and also with large memory space in the encoder core for all coding tables used by the encoder.

In FIG. 10A, all 19 VLC tables are implemented into encoder H/W storage in some embodiments. In FIG. 10A, an entropy encoder core for AVS residual layer has Context Manager, VLC Encoder, 19 VLC tables and 4 Exp-Golomb Encoder cores. The scanned results flow into the Context Manager and VLC Encoder. The Context Manager checks the value of the scanned coefficients, and defines which VLC table and which Exp-Golomb encoder core 0, 1, 2 or 3 are to be applied. The VLC encoder converts the coefficients into symbol values by using the particular VLC table selected by the Context Manager. The output symbol from the VLC table is sent to the Exp-Golomb encoder, and the output of the Exp-Golomb encoder is sent to the stream buffer. In this way, encoding each coefficient is accomplished.

Figure 10B:
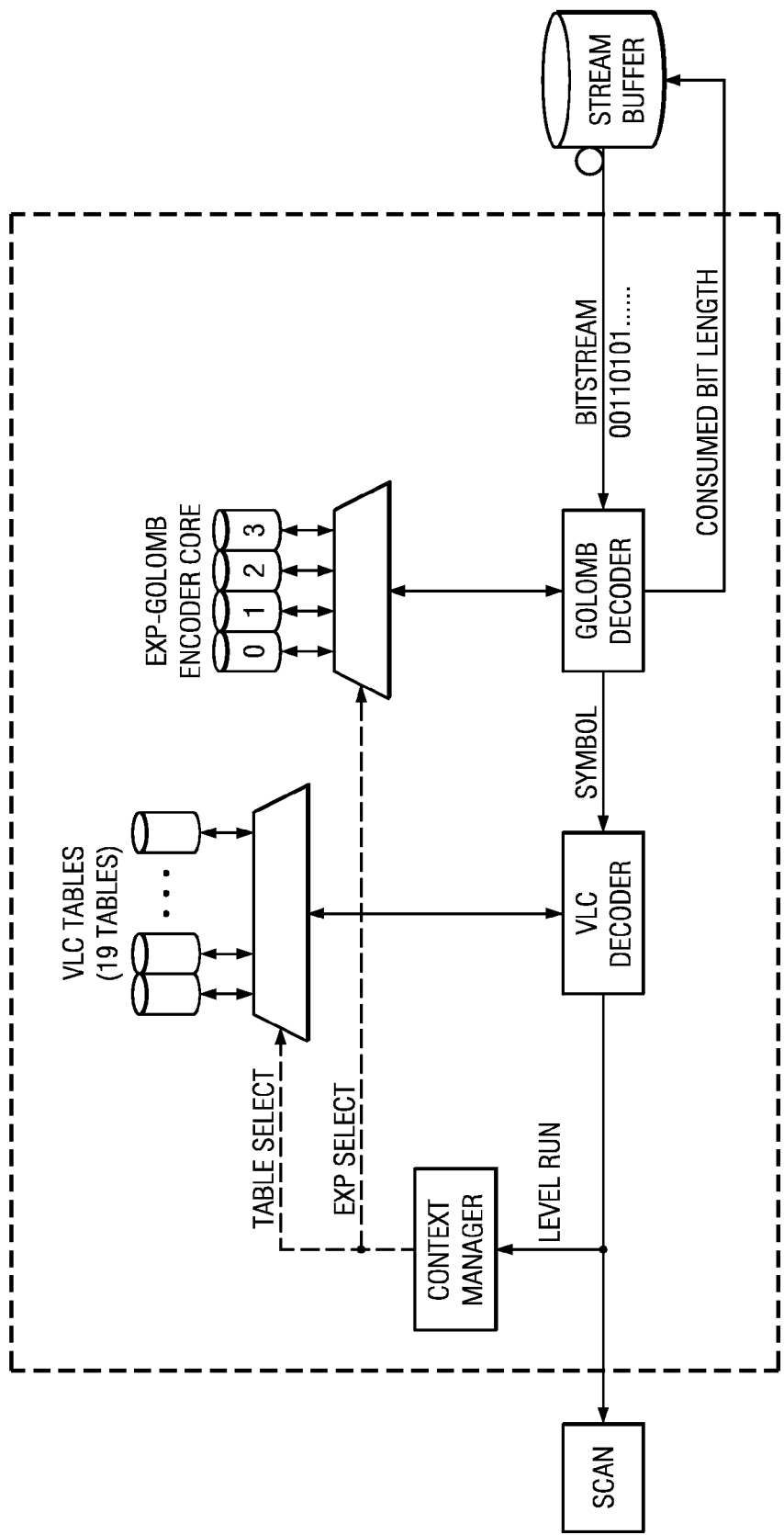
FIG. 10B. is a block diagram of a decoder analogous to the encoder of FIG. 10A.

Conversely on conventional decode in FIG. 10B, the decoder core consists of 4 types of Exp-Golomb decoder, 19 VLC tables, VLC decoder and Context Manager. Firstly, the Exp-Golomb decoder reads the bitstream and obtains symbol and consumed bit length. The bit length is sent to stream buffer and defines a pointer of the stream buffer for decoding a next symbol. The obtained symbol is sent to VLC decoder. The VLC decoder decodes the symbol and obtains Level and Run by applying the VLC table selected by context manager. The obtained Level and Run are sent to inverse scan and Context Manager. The Context Manager updates the selection of VLC table and Exp-Golomb decoder to be applied to next coefficient. In this way, conventional decoding of a coefficient is accomplished.

Figure 5:
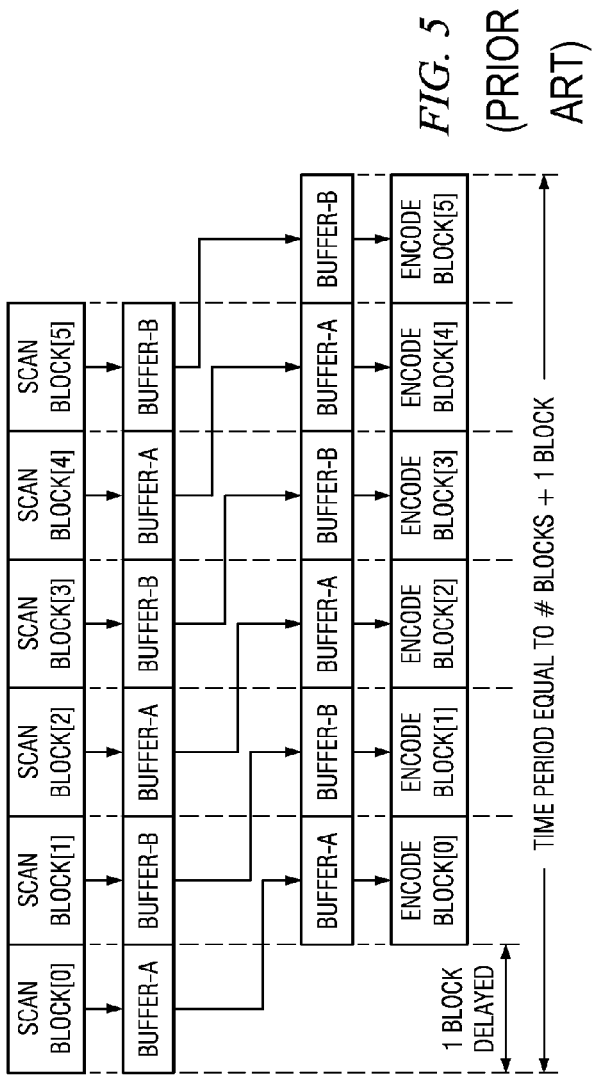
FIG. 5 is a block level timing diagram of scan and encoding operations corresponding to FIG. 4 and producing one-block delay or latency.

In FIG. 10A, some embodiments of FIGS. 7A-8C pre-store all 19 tables for 2D-CAVLC in an albeit space-consuming internal ROM in an AVS H/W core to maintain performance in case of unlikely scenarios wherein most or all coefficients in a block have Level value. This approach is predicated or premised on avoiding a reduction in performance that could be caused by accumulation of numerous otherwise-external memory access latencies. Conventionally, given the opposed scanning and coding orders of FIG. 4, such latencies would seem unhideable and cumulative if the matter were considered at all, and such latencies would presumably be unavoidable. Several clock cycles would be spent or expended on each external memory access to read code of the CAVLC if it were not internal to the AVS H/W core, given the opposed scanning and coding orders. The circuit of FIG. 10A in some embodiments here is provided with the special scan block having reversed-scan, and the one-block latency of FIG. 5 is thereby eliminated in such embodiments.

Here, moreover, some additional embodiments of FIGS. 11A, 12A, 12C and 13A can even omit the 19-VLC ROM space in the encoder core H/W and are operable to boot-store or otherwise prepare all 19 CAVLC tables in an external large buffer 870 outside the H/W encoder core 800. Latency of each or most every external VLC table access is effectively eliminated or hidden and mainly or preponderantly killed by parallelizing and hiding the clock cycles of such access latency behind the clock cycles for the Run counter in the special scan block of FIG. 8B. This works because, on average usually and statistically, some AC coefficients are 0 (zero) and thus contribute to a Run that occupies Run Counter 528 cycles. And omitting the ROM table beneficially reduces logic size and power consumption in the encoder core. By reversing the opposed scanning and coding orders of FIG. 4 to have same scanning and coding orders, the embodiments FIGS. 7C, 8B, 12A and 12C set aside any premise of substantial unhideable accumulation of memory access latencies and confer remarkable residual encoder embodiments for performance and economy.

Additionally, for an example VLC access latency-hiding embodiment, an encoding structure and process or method herein provides a volatile memory space 860 internal to the encoder core instead of the large internal ROM VLC space and furthermore reduces the size of the encoder H/W memory space for VLC to hold just one VLC table. From the description of FIG. 8A, and FIGS. 8B and 8C, one finds latency of scan and entropy coding for a period between two neighboured Levels (former one is registered, and then encoded into bitstream when latter one is found and registered). It means that the encoder 800 can check the formerly registered Level and reads only one VLC table from external memory 870 outside of the encoder during a time period for checking next Level because latency due to memory access can be hidden by this internal latency of the encoder. Discussion of the structure and process for hiding the memory access latency behind the Run counter 528 is further provided in connection with FIG. 12A after describing this light and fast encoder embodiment at top level in FIG. 11A.

Figure 11A:
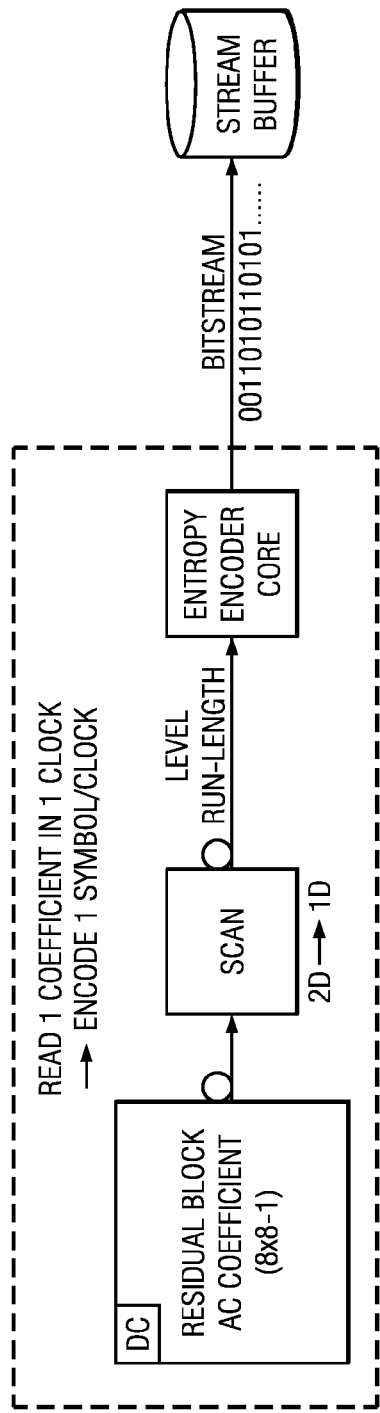
FIG. 11A is a high-level block diagram of an inventive hardware encoder core for high per-clock performance.
Figure 13A:
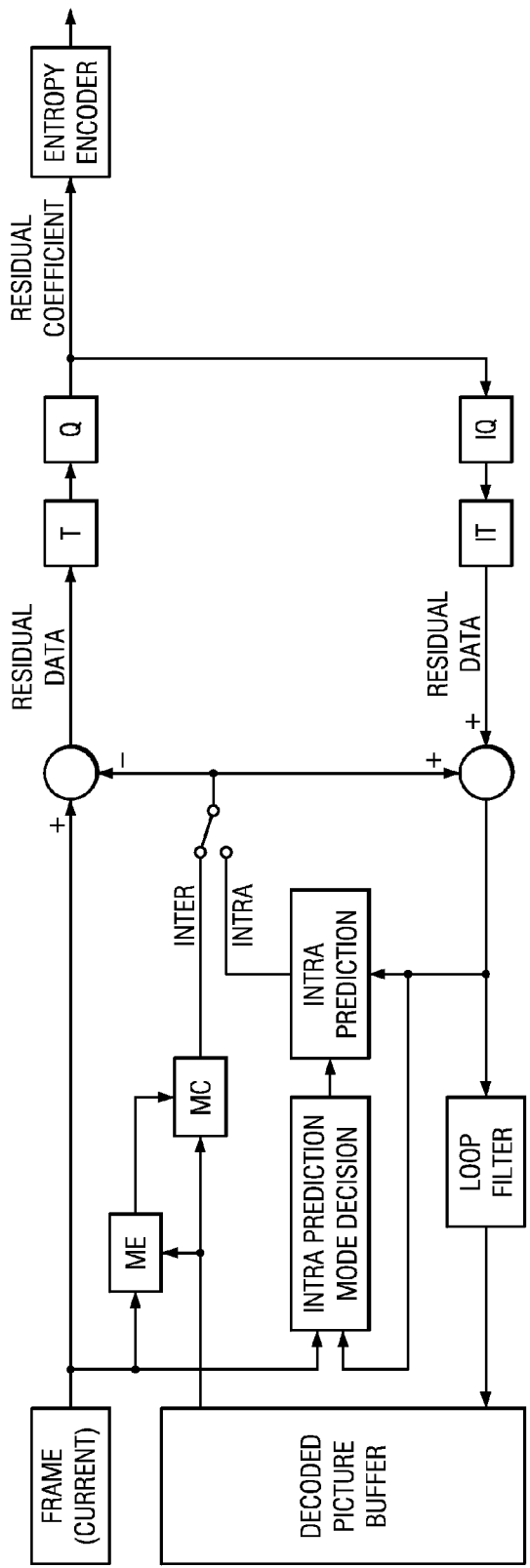
FIG. 13A is a block diagram of an inventive image encoder system for producing residual coefficients from a current image frame and inventively scanning and encoding them as shown in the other Figures.

In FIG. 11A, storage for an 8×8 Residual Block is situated at and occupies the point in the encoder block diagram of FIG. 13A labeled Residual Coefficient. Analogously, in FIG. 11B, the Residual Block is situated at and occupies the point in the encoder of FIG. 13B labeled Residual Coefficient. FIGS. 12A and 12B respectively represent a detail of the blocks of FIGS. 11A and 11B.

In the FIG. 11A encoder embodiment, the Residual Block is scanned out from two dimensions to one dimension (2D to 1D) in the special AC-to-DC order 63 to zero as described earlier hereinabove for FIGS. 7A-8C. Level and Run-length are output as in waveform FIG. 8A, block diagram FIG. 8B and flow FIG. 8C. The scanned out coefficients and Level and Run-length are fed to the Entropy Encoder core as described for FIG. 12A so as to provide a pipelined flow that reads one coefficient in one clock and encodes at a rate of one symbol per clock to produce a bitstream as output from Entropy Encoder block of FIGS. 11A, 12A and 13A to a stream buffer in FIGS. 11A and 12A.

Figure 11B:
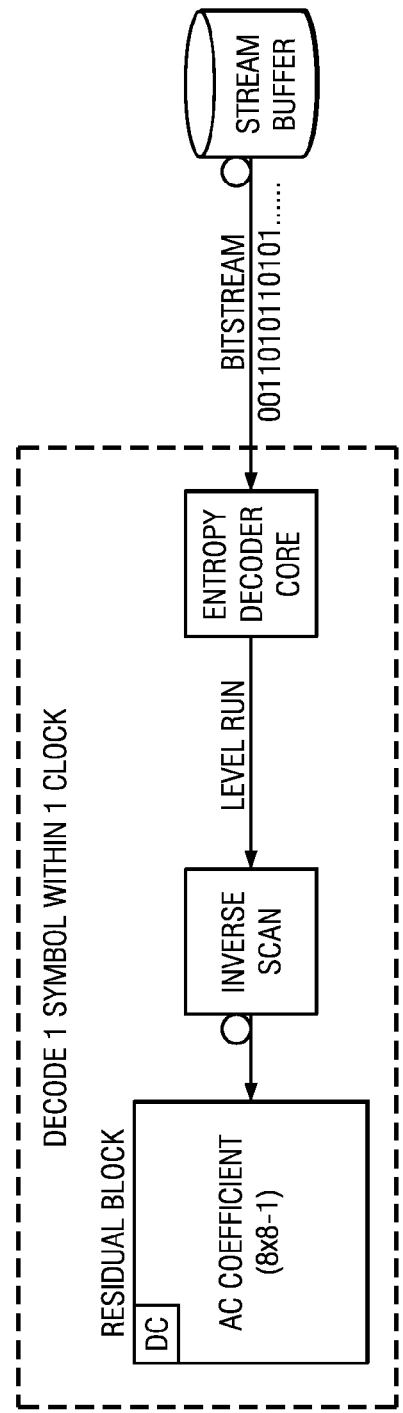
FIG. 11B is a high-level block diagram of an inventive decoder core for high per-clock performance.
Figure 13B:
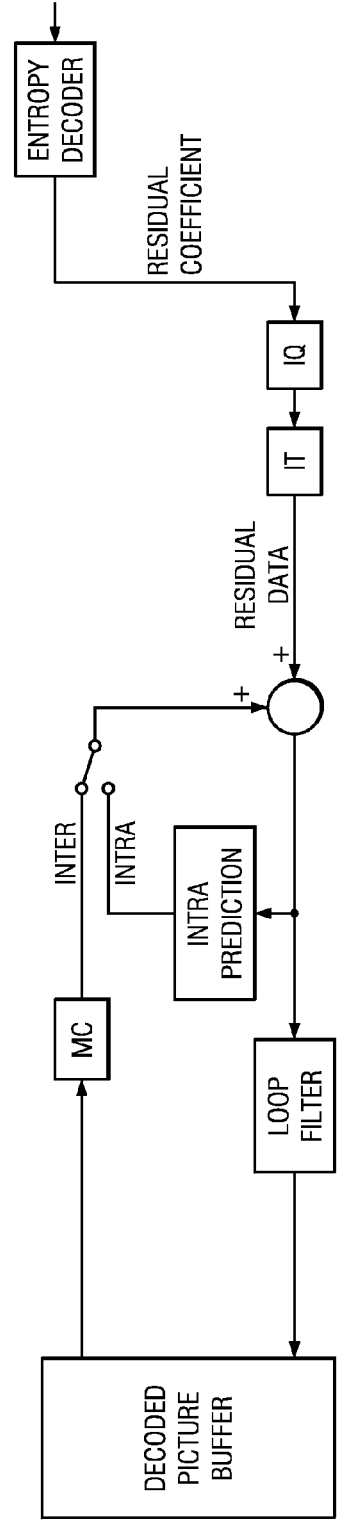
FIG. 13B is a block diagram of an inventive image decoder system inventively decoding and inverse-scanning residual coefficients as shown in the other Figures and further providing a decoded picture image.

Conversely in a FIG. 11B decoder embodiment, an analogous bitstream from a stream buffer in FIG. 11B is input to an Entropy Decoder Core in Entropy Decode block of FIGS. 11B, 12B and 13B. Entropy Decoder Core 900 outputs 1D stream of coefficients along with Level and Run-length to an Inverse Scan block 940 that outputs coefficients to fill up the 2D Residual Block 950 with residual coefficients. On decode in this embodiment, the order of inverse scan is arranged to be same as order of entropy decoding within a block. In this way the Decoder provides a pipelined flow that decodes at a rate of one symbol per clock and inverse-scan-writes one coefficient in one clock to fill up the Residual Block in two dimensions 2D in an embodiment for decode that operates conversely or inversely to an embodiment for encode. A bitstream symbol includes or represents Level and Run information. Each successive Level cell is written with its Level value at a Level cell address formed by summing or combining the last Level cell address and the Run information to work downward in the block in AC-to-DC order. All cells in the 8×8 block storage 950 have been previously initialized with zeroes before decoding the block. Intermediate Run cells intermediate the Level cells remain initialized with zeroes in the 8×8 block storage and are skipped over in the addressing process and automatically constitute the zero-valued Run coefficients by default. Overall, a stream buffer 910 supplies a variable-length-coded bit stream to a Golomb decoder 920 supported via a mux 936 by Exp-Golomb Decoder cores 937 for exponents 0, 1, 2, 3. A VLC Decoder 930 aided by an applicable VLC Table in small memory space 960 decodes each symbol from Golomb decoder 920 and outputs Level & Run value pairs to Inverse Scan 940 and Context Manager 980 unbuffered. Context Manager 980 supplies VLC Table select control to external large buffer 970 and thereby delivers the applicable VLC coding table into small memory space 960. Decode of a subsequent Run-Level is performed on the basis of the next-previous Run-Level information. Context Manager 980 also supplies an exponent select control Exp. Select to control selection by mux 936.

Returning to encode, an encoder embodiment of FIG. 12A provides a reduced memory area 860 inside the encoder core H/W to store VLC table data from as little as only one VLC table, which allows or delivers encoder memory size reduction in an embodiment herein for achieving an AVS residual encoder. The data for the 19 VLC tables is instead put in a FIG. 12A cache 870 (e.g., a Level 2 cache L2 or SL2) where the data are readily accessible and the cache 870 access latency is acceptable and hidden herein and the cache space is re-usable for other applications when the encoder 800 is not executing.

Regarding table selection in FIG. 9 and FIG. 12A, in FIG. 9, the Level value is only applied to select the next VLC table. In FIG. 12A, the Level value, or both the Level value and Run value are applied to select a next symbol value in the next VLC table. Two operations are applied in FIG. 12A: 1) selecting the next VLC table from cache 870 and 2) deriving a symbol value from the selected VLC table in small space 860. FIG. 12A saves memory area. If the Run value is a large value, or even a modestly significant value, the embodiment also saves and hides behind clock cycles consumed for counting the number of consecutive zero-coefficients by checking only one symbol value from VLC table in or obtained from L2 cache. In this structure and method, a symbol value applied to Run/Level is only read from a VLC table in table space 860, a VLC table that is selected from the VLC tables stored in external L2 cache. This way, the encoder does not have to have space for so many VLC tables, indeed table space 860 for one VLC table in the encoder hardware is enough herein.

Moreover, reading the 2D CAVLC table is parallelized and hidden in some embodiments. Here, clock cycles for Run-counting the zero-valued AC coefficients are also consumed for reading the selected one VLC table out of 19 tables from L2 cache into internal VLC space reduced to hold just one VLC table. The same clock cycles are used both for Run-counting each zero-valued coefficient and for reading the selected single VLC table.

In FIGS. 12A, 12C and 8A, 8B, the encoder scan block 820 consumes successive cycles for incrementing Run counter 528 when there is a multi-cycle Run length. Some embodiments beneficially utilize the same several clock cycles that Run counting occupies to read code of the Level-selected Huffman VLC table from cache memory 870 that holds 19 VLC tables into the residual encoder storage space 860 having VLC storage area for just one VLC table. Such embodiments herein can accomplish this because the reversed-scan embodiment of FIG. 7C uses the Level Detector 524 and Level register 526 of FIGS. 8A and 8B to acquire the Level value, on which the VLC table selection (step (4) in description of FIG. 9) depends, before or just as the Run counter 528 of FIG. 8B commences counting Run-length, not afterwards. Accordingly, these operations just-in-time parallelize and hide some or all of the clock cycles involved in accessing the thereby-selected VLC table from cache.

In FIG. 8B, the line AC Encode Enable triggers a selection and read of data from one of the 19 VLC tables in L2 cache into the single VLC table space of FIG. 12A, 12C in the entropy encoder hardware. Note that the AC Encode Enable line in FIG. 8B is the same line (or coupled with insignificant delay to) the Enable for Run Counter 528 in FIG. 8B. The AC Encode Enable line in FIG. 8B goes to blocks as appropriate to activate the entropy encoder parts of FIG. 12A, 12C and specifically here to the Context Manager 880 in FIGS. 12A, 12C that commences the VLC Table access from cache 870 compatibly with FIG. 9. Consequently, the Run counting in the FIGS. 8B and 12A, 12C Scan block 820 and the accessing of selected VLC table from cache 870 in FIG. 12A and FIG. 12C are concurrent and thus hide some or all of the cache 870 memory access latency.

FIG. 12C emphasizes the important parts of the AVS or H.264 encoder embodiment shown therein. The encoder scan block 820 uses a scan order AC-to-DC, which is a special reversed-scan to match the entropy coding order that is applied in the AC-to-DC direction of FIG. 7C to Run/Level data pipelined in from the scan block. The Table select from Context Manager 880 to external buffer in cache 870 (e.g., L2/SL2) is Level-based and initiated or actuated by AC Encode Enable in FIGS. 8B and 12C without need of the as-yet-in-progress counting of Run-length. Compare FIG. 12C to FIG. 9 Level-based table selection from FIG. 10A ROM. Cache memory 870 access clock cycles are thereby parallelized and hidden in FIG. 12C behind the oncoming Run counter 528 clock cycles in FIGS. 8A, 8B. When the Run count does count up and establish the Run-length, the now-established Run-length is signaled by the circuitry to the VLC candidate table space 860 in the entropy encoder real-estate 800 and/or otherwise as appropriate to facilitate the completion of the entropy coding.

Scan 820 scans block 810 and outputs Level/Run value pairs to Context Manager 880 unbuffered on line 824. Likewise, Scan 820 sends the Level/Run value pairs on line 826 to a symbol encoder including Escape Decision circuit 839 coupled (non-escape) to VLC Encoder 832. A Mux 838 supplies Golomb Encoder 834 with each latest symbol from VLC Encoder 832 or from Escape Decision circuit 839 depending whether an escape condition exists or not. Context Manager 880 supplies VLC Table select control to external large buffer 870 and thereby delivers the applicable VLC coding table into small memory space 860 that acts as a coding memory space able only to hold substantially fewer than the plurality of coding tables in buffer 870. VLC encoder 832 is coupled to access only the coding memory space 860 instead of the re-usable store space 870 for coding table information. Golomb encoder 834 is supported via a mux 836 by Exp-Golomb Encoder cores 837 for exponents 0, 1, 2, 3. VLC Encoder 832 aided by the applicable VLC Table in small memory space 860 encodes each Level/Run value pair from Scan 820 into a symbol for Golomb encoder 834. Context Manager 880 also supplies an exponent select control Exp. Select to control selection by mux 836 for Golomb encoder 834. Golomb encoder 834 encodes each symbol from mux 838 and supplies a resulting variable-length-coded bit stream to a stream buffer 840.

In FIG. 12A and FIG. 12C, the table selection from the 19 VLC tables is responsive to the FIG. 8B Level value (and not Run) input to the Entropy Encoder when AC Encode Enable of FIG. 8B goes active.

As described hereinabove for FIG. 7C, the encoder scanning order is same as the entropy coding order. The encoder embodiments of FIGS. 7A-13B start scanning the residual coefficients in a block from the last ($64^{th}$) AC position to DC position according to the following flow steps augmented to hide VLC cache accesses:

(1) Encoder starts scanning coefficients from bottom-right (d63) of a block in FIGS. 7A and 7C in a scanning order represented by FIG. 7B.
(2) When the encoder finds a Level coefficient for the first time from (1), the Level coefficient is stored in the Level register 526 of FIGS. 8A and 8B.
(3) When the encoder finds a next Level coefficient after (2), the encoder uses the selection procedure of FIG. 9 to select and access one VLC table from 19 VLC tables in L2 cache 870 and transfer the selected VLC Table data thus selected into much-reduced single-VLC-table space 860 on precious encoder real estate 800. Concurrently, the Run counter 528 value counts up and reaches the value that is equivalent to Run-length. The encoder entropy codes based on the already-registered Level coefficient and now-available Run counter value and the now-present selected VLC table. In the meantime, the successively-new Level coefficient is registered and the Run counter 528 is reset to 0 (zero).
(4) The encoder repeats action of (3) until scanning position reaches DC coefficient d00.
(5) When the encoder reaches DC position, an additional pulse is asserted in order to initiate entropy coding of the last Level coefficient (d00) with Run-length zero.

During scanning of residual coefficients, scan pipeline latency in FIGS. 8A and 8B comprehends or spans a number of clock cycles equal to Run-length. So, the encoder selects, transfers and/or prepares one VLC table in a small space 860 inside the encoder for the one VLC table selected from cache or other external memory 870 during this Run counter latency, which means that the read time for reading a VLC table is hidden by this Run counter latency. In this way, encoder processing time and overhead is removed or reduced.

Benefits and solved problems conferred by some embodiments herein include any or all of the following, among others: 1) elimination of FIG. 6 buffer memory 335 for Level coefficient and Run-length, 2) integrated circuit real estate economy by eliminating that buffer memory space and its control circuitry, 3) power savings likewise, 4) elimination of FIG. 5 block-level pipeline latency during encoding residual layer, since the order of scan and of entropy coding no longer oppose each other, 5) reduction of VLC table space in the encoder, from 19 VLC table spaces to one VLC table space 860, and 6) hiding external memory accesses to VLC tables behind the encoder scan latency because reversed scan finds each Level value, on which VLC table selection depends, before a Run latency occurs and therefore the Run latency can be leveraged to hide the external memory accesses. Various embodiments make contributions to encoding/decoding HDTV images and other image types in real-time.

In FIG. 13A, an AVS encoder has Motion Estimation ME, Motion Compensation MC, intra prediction, transform T, quantization Q and loop-filter. Since AVS is very similar to H.264, embodiments of encoders and encoding as taught herein can be provided to improve performance and economy relative to both AVS and H.264 standards and other standards that can similarly benefit. An Entropy encoder block is improved remarkably as taught herein and placed or situated behind quantization. Here, output data from quantization Q is called a residual coefficient. The entropy encoder block such as in FIGS. 12A and 12C reads the residual coefficient and some information for syntax of Macroblock header, and converts them into an output bitstream. During encoding, exp-golomb code and 2D-CAVLC (context adaptive VLC) are applied with substantial performance enhancement, latency reduction, and improved real-estate and power economies as described herein. Feedback is provided by blocks for motion compensation MC, Intra Prediction, inverse transform IT, inverse quantization IQ and loop filter.

In FIG. 13A, a current Frame is fed from a Frame buffer to a summing first input of an upper summer. The upper summer has a subtractive second input that is coupled to the selector of a switch that selects between predictions for Inter and Intra Macroblocks. The upper summer subtracts the applicable prediction from the current Frame to produce Residual Data as its output. The Residual Data is fed to Transform T and then to Quantization Q. Quantization Q delivers quantized Residual Coefficients in 8×8 blocks, for instance, as discussed in other Figures herein for processing by an Entropy Encode block (also called the encoder in the other Figures such as in FIGS. 11A, 12A and 12C which include detailed FIG. 8B reverse-order scanning circuitry and entropy encoder circuitry).

Further in FIG. 13A, the Residual Coefficients are fed back through inverse quantization IQ and inverse transform IT to supply reconstructed Residual Data to a summing first input of a lower summer. The lower summer has a summing second input that is coupled to and fed by the already-mentioned selector of a switch that selects between the predictions for Inter and Intra Macroblocks. The lower summer adds the applicable prediction to the reconstructed Residual Data to produce a lower summer output. The lower summer output is 1) fed to a Loop Filter and 2) also feeds an Intra Prediction block to provide the switch with the Intra prediction, and 3) further feeds a first input of a block for Intra Prediction Mode Decision. The current Frame is fed to a second input of the block for Intra Prediction Mode Decision, which in turn delivers a mode decision to the Intra Prediction block.

The Loop Filter is coupled at its output to write into and store data in a Decoded Picture Buffer. Data is read from the Decoded Picture Buffer into two blocks designated ME (Motion Estimation) and MC (Motion Compensation). The current Frame is fed to motion estimation ME at a second input thereof, and the ME block supplies a motion estimation output to a second input of block MC. The block MC outputs motion compensation data to the Inter input of the already-mentioned switch. In this way, the image encoder is implemented in hardware, or executed in hardware and software in the IVA processing block of FIG. 14, and efficiently compresses image Frames and entropy encodes the resulting Residual Coefficients as taught herein.

The AVS decoder of FIG. 13B is a subset of FIG. 13A in that, compared to FIG. 13, FIG. 13B substitutes a box Entropy Decode for Entropy Encode, uses the feedback blocks, and omits the blocks Frame (current) and associated block Intra Prediction Mode Decision, and further omits Motion Estimation ME, upper summer, Transform T and Quantization Q.

In the decoder embodiment of FIG. 13B, the entropy decoder block improved as in FIG. 12B, for one example, reads the bitstream and converts it into residual coefficients and some information for syntax of the Macroblock header such as motion vector and Macroblock type. An exp-golomb decoder and 2D-CAVLD are applied in the FIG. 12B improved entropy decoder block. The residual coefficients are inverse quantized in block IQ, and an inverse of the transform T is applied by block IT producing residual data. The residual data is applied to a FIG. 13B summer (lower summer of FIG. 13A). Summer output is fed to an Intra Prediction block and also via the Loop Filter to a Decoded Picture Buffer. Motion Compensation block MC reads the Decoded Picture Buffer and provides output to the Inter input of a switch for selecting Inter or Intra. Intra Prediction block provides output to the Intra input of that switch. The selected Inter or Intra output is fed from the switch to a second summing input of the summer. In this way, an image is constituted by summing the Inter or Intra data plus the Residual Data.

Figure 14:
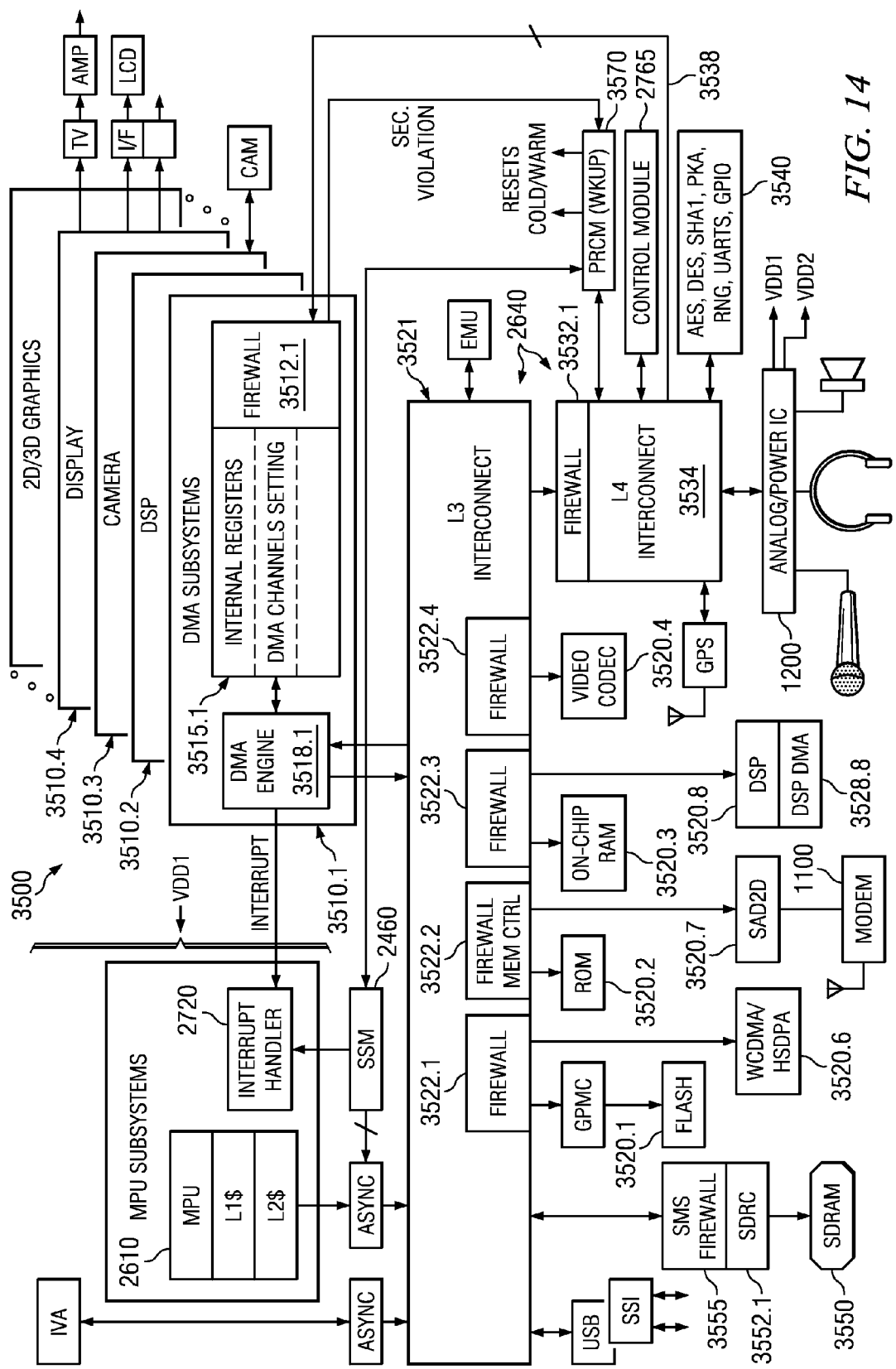
FIG. 14 is a block diagram of circuit blocks of an inventive electronic system including the inventive circuits of the other Figures.

Some embodiments of the residual encoder are implemented in IVA-HD hardware of FIG. 14 or otherwise appropriately to form more comprehensive system-on-chip embodiments for larger device and system embodiments, as described next. In FIG. 14, a system embodiment 3500 improved as in the other Figures has an MPU subsystem and the IVA subsystem, and DMA (Direct Memory Access) subsystems 3510.*i*. The MPU subsystem suitably has one or more processors with CPUs such as RISC or CISC processors 2610, and having superscalar processor pipeline(s) with L1 and L2 caches. The IVA subsystem has one or more programmable digital signal processors (DSPs), such as processors having single cycle multiply-accumulates for image processing, video processing, and audio processing. IVA provides multi-standard (AVS, H.264, H.263, MPEG4, WMV9, RealVideo®) encode/decode at D1 (720×480 pixels), and 720p MPEG4 decode, for some examples. The AVS codec for IVA is improved for high speed and low real-estate impact as described in the other Figures herein. Also integrated are a 2D/3D graphics engine, a Mobile DDR Interface, and numerous integrated peripherals as selected for a particular system solution. The IVA subsystem has L1 and L2 caches, RAM and ROM, and hardware accelerators as desired such as for motion estimation, variable length codec, and other processing. DMA (direct memory access) performs target accesses via target firewalls 3522.*i* and 3512.*i* of FIG. 14 connected on interconnects 2640. A target is a circuit block targeted or accessed by another circuit block operating as an initiator. In order to perform such accesses the DMA channels in DMA subsystems 3510.*i* are programmed. Each DMA channel specifies the source location of the Data to be transferred from an initiator and the destination location of the Data for a target. Some Initiators are MPU 2610, DSP DMA 3510.2, SDMA 3510.1, Universal Serial Bus USB HS, virtual processor data read/write and instruction access, virtual system direct memory access, display 3510.4, DSP MMU (memory management unit), camera 3510.3, and a secure debug access port to emulation block EMU.

Data exchange between a peripheral subsystem and a memory subsystem and general system transactions from memory to memory are handled by the System SDMA 3510.1. Data exchanges within a DSP subsystem 3510.2 are handled by the DSP DMA 3518.2. Data exchange to store camera capture is handled using a Camera DMA 3518.3 in camera subsystem CAM 3510.3. The CAM subsystem 3510.3 suitably handles one or two camera inputs of either serial or parallel data transfer types, and provides image capture hardware image pipeline and preview. Data exchange to refresh a display is handled in a display subsystem 3510.4 using a DISP (display) DMA 3518.4. This subsystem 3510.4, for instance, includes a dual output three layer display processor for 1×Graphics and 2×Video, temporal dithering (turning pixels on and off to produce grays or intermediate colors) and SDTV to QCIF video format and translation between other video format pairs. The Display block 3510.4 feeds an LCD (liquid crystal display), plasma display, DLP™ display panel or DLP™ projector system, using either a serial or parallel interface. Also television output TV and Amp provide CVBS or S-Video output and other television output types.

In FIG. 14, a hardware security architecture including SSM 2460 propagates Mreqxxx qualifiers on the interconnect 3521 and 3534. The MPU 2610 issues bus transactions and sets some qualifiers on Interconnect 3521. SSM 2460 also provides one or more MreqSystem qualifiers. The bus transactions propagate through the L4 Interconnect 3534 and line 3538 then reach a DMA Access Properties Firewall 3512.1. Transactions are coupled to a DMA engine 3518.$i$ in each subsystem 3510.$i$ which supplies a subsystem-specific interrupt to the Interrupt Handler 2720. Interrupt Handler 2720 is also fed one or more interrupts from Secure State Machine SSM 2460 that performs security protection functions. Interrupt Handler 2720 outputs interrupts for MPU 2610. In FIG. 14, firewall protection by firewalls 3522.$i$ is provided for various system blocks 3520.$i$, such as GPMC (General Purpose Memory Controller) to Flash memory 3520.1, ROM 3520.2, on-chip RAM 3520.3, Video Codec 3520.4, WCDMA/HSDPA 3520.6, device-to-device SAD2D 3520.7 to Modem chip 1100, and a DSP 3520.8 and DSP DMA 3528.8. In some system embodiments, Video Codec 3520.4 has codec embodiments as shown in the other Figures herein. A System Memory Interface SMS with SMS Firewall 3555 is coupled to SDRC 3552.1 (External Memory Interface EMIF with SDRAM Refresh Controller) and to system SDRAM 3550 (Synchronous Dynamic Random Access Memory).

Figure 1:
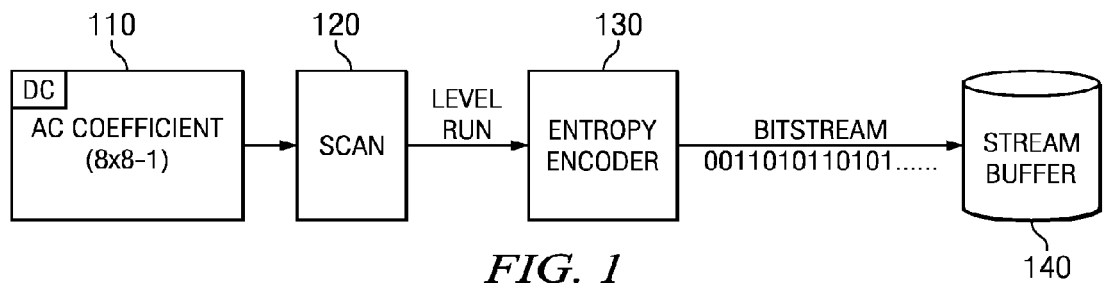
FIG. 1 is a block diagram of an image encoder.
Figure 3A:
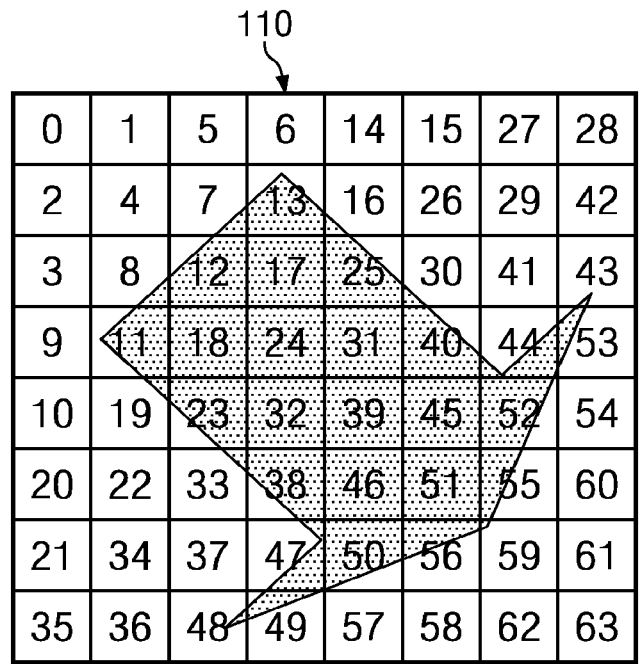
FIG. 3A is a diagram of a conventional DC-to-AC scan of a block.
Figure 3B:
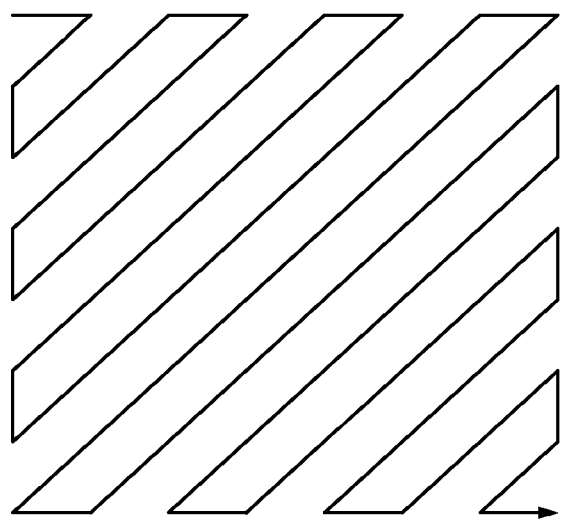
FIG. 3B is a line diagram of a zig-zag scanning order in the FIG. 3A DC-to-AC scan of a block.

In FIG. 14, interconnect 3534 is also coupled to Control Module 2765 and cryptographic accelerators block 3540 and PRCM 3570. Power, Reset and Clock Manager PCRM 3570 is coupled via L4 interconnect 3534 to Power IC circuitry in chip 1200 of FIGS. 1-3, which supplies controllable supply voltages VDD1, VDD2, etc. PRCM 3570 is coupled to L4 Interconnect 3534 and coupled to Control Module 2765. PRCM 3570 is coupled to a DMA Firewall 3512.1 to receive a Security Violation signal, if a security violation occurs, and to respond with a Cold or Warm Reset output. Also PRCM 3570 is coupled to the SSM 2460.

In FIG. 14, some embodiments have symmetric multiprocessing (SMP) core(s) such as RISC processor cores in the MPU subsystem. One of the cores is called the SMP core. A hardware (HW) supported secure hypervisor runs at least on the SMP core. Linux SMP HLOS (high-level operating system) is symmetric across all cores and is chosen as the master HLOS in some embodiments.

The system embodiments of and for FIG. 14 are provided in a communications system and implemented as various embodiments in any one, some or all of cellular mobile telephone and data handsets, a cellular (telephony and data) base station, a WLAN AP (wireless local area network access point, IEEE 802.11 or otherwise), a Voice over WLAN Gateway with user video/voice over packet telephone, and a video/voice enabled personal computer (PC) with another user video/voice over packet telephone, that communicate with each other. A camera CAM provides video pickup for a cell phone or other device to send over the internet to another cell phone, personal digital assistant/personal entertainment unit, gateway and/or set top box STB with television TV. Video storage and other storage, such as hard drive, flash drive, high density memory, and/or compact disk (CD) is provided for digital video recording (DVR) embodiments such as for delayed reproduction, transcoding, and retransmission of video to other handsets and other destinations.

In FIG. 14, a Modem integrated circuit (IC) 1100 supports and provides wireless interfaces for any one or more of GSM, GPRS, EDGE, UMTS, and OFDMA/MIMO embodiments. Codecs for any or all of CDMA (Code Division Multiple Access), CDMA2000, and/or WCDMA (wideband CDMA or UMTS) wireless are provided, suitably with HSDPA/ HSUPA (High Speed Downlink Packet Access, High Speed Uplink Packet Access) (or 1×EV-DV, 1×EV-DO or 3×EV-DV) data feature via an analog baseband chip and RF GSM/CDMA chip to a wireless antenna. Replication of blocks and antennas is provided in a cost-efficient manner to support MIMO OFDMA of some embodiments. An audio block in an Analog/Power IC 1200 has audio I/O (input/output) circuits to a speaker, a microphone, and/or headphones as illustrated in FIG. 14. A touch screen interface is coupled to a touch screen XY off-chip in some embodiments for display and control. A battery provides power to mobile embodiments of the system and battery data on suitably provided lines from the battery pack.

DLP™ display technology from Texas Instruments Incorporated is coupled to one or more imaging/video interfaces. A transparent organic semiconductor display is provided on one or more windows of a vehicle and wirelessly or wireline-coupled to the video feed. WLAN and/or WiMax integrated circuit MAC (media access controller), PHY (physical layer) and AFE (analog front end) support streaming video over WLAN. A MIMO UWB (ultra wideband) MAC/PHY supports OFDM in 3-10 GHz UWB bands for communications in some embodiments. A digital video integrated circuit provides television antenna tuning, antenna selection, filtering, RF input stage for recovering video/audio and controls from a DVB station.

Various embodiments are used with one or more microprocessors, each microprocessor having a pipeline, and selected from the group consisting of 1) reduced instruction set computing (RISC), 2) digital signal processing (DSP), 3) complex instruction set computing (CISC), 4) superscalar, 5) skewed pipelines, 6) in-order, 7) out-of-order, 8) very long instruction word (VLIW), 9) single instruction multiple data (SIMD), 10) multiple instruction multiple data (MIMD), 11) multiple-core using any one or more of the foregoing, and 12) microcontroller pipelines, control peripherals, and other microcontrol blocks using any one or more of the foregoing.

Various embodiments as described herein are manufactured in a process that prepares RTL (register transfer language) and netlist for a particular design including circuits of the Figures herein in one or more integrated circuits or a system. The design of the encoder and decoder and other hardware is verified in simulation electronically on the RTL and netlist. Verification checks contents and timing of registers, operation of hardware circuits under various configurations, AVS and H.264 latency and memory access latency-hiding, real-time and non-real-time operations and interrupts, responsiveness to transitions through modes, sleep/wakeup, and various attack scenarios. When satisfactory, the verified design dataset and pattern generation dataset go to fabrication in a wafer fab and packaging/assembly produces a resulting integrated circuit and tests it with real time video. Testing verifies operations directly on first-silicon and production samples such as by using scan chain methodology on registers and other circuitry until satisfactory chips are obtained. A particular design and printed wiring board (PWB) of the system unit, has a video codec applications processor coupled to a modem, together with one or more peripherals coupled to the processor and a user interface coupled to the processor. A storage, such as SDRAM and Flash memory is coupled to the system and has VLC tables, configuration and parameters and a real-time operating system RTOS, image codec-related software Public HLOS, protected applications (PPAs and PAs), and other supervisory software. System testing tests operations of the integrated circuit(s) and system in actual application for efficiency and satisfactory operation of fixed or mobile video display for continuity of content, phone, e-mails/data service, web browsing, voice over packet, content player for continuity of content, camera/imaging, audio/ video synchronization, and other such operation that is apparent to the human user and can be evaluated by system use. Also, various attack scenarios are applied. If further increased efficiency is called for, parameter(s) are reconfigured for further testing. Adjusted parameter(s) are loaded into the Flash memory or otherwise, components are assembled on PWB to produce resulting system units.

ASPECTS (See Notes paragraph at end of this Aspects section.)

11A. The encoder process claimed in claim 11 wherein the scanning and the variable-length encoding together have single-clock per coefficient performance.

11B. The encoder process claimed in claim 11 wherein the coefficients include residual coefficients.

14A. The encoder process claimed in claim 14 wherein the scanning produces at least one Level datum representing a non-zero image transform-based coefficient and at least one Run datum representing a count of consecutive zero-filled entries subsequent to the Level datum in the scanning order.

14B. The encoder process claimed in claim 14 further comprising, upon the scanning encountering a Level datum, then registering the Level datum and counting consecutive zero coefficients to generate a Run datum.

25A. The decode circuit claimed in claim 25 wherein said Run-Level decoder includes a symbol decoder to produce the succession of pairs of values, and a data stream decoder having an input for a data stream and an output for a succession of symbols coupled to said symbol decoder.

25A1. The decode circuit claimed in claim 25A wherein the succession of pairs of values arriving from said symbol decoder has its AC to DC order corresponding to an order of succession of symbols from said data stream decoder.

25A2. The decode circuit claimed in claim 25A wherein said data stream decoder includes a set of exponential decoder cores.

25A2A. The decode circuit claimed in claim 25A2 further comprising a selection circuit operable in response to said symbol decoder to generate an exponent selection signal to select one of the exponential decoder cores for said data stream decoder to use to output a next symbol.

25A2A1. The decode circuit claimed in claim 25A2A wherein said data stream decoder, said selection circuit, said symbol decoder, and said inverse-scanner form a decoder core that also includes an internal VLC table memory space coupled to said symbol decoder and also to an input for receiving a selected single VLC table from elsewhere external to said decoder core.

25A3. The decode circuit claimed in claim 25A further comprising a stream buffer, wherein said data stream decoder is operable to read a data stream from said stream buffer and obtain the succession of symbols.

25A3A. The decode circuit claimed in claim 25A3 wherein said data stream decoder is further operable to decode a consumed bit length value, and to send the consumed bit length value to said stream buffer, and said stream buffer is responsive to the consumed bit length value from said data stream decoder to define a pointer of the stream buffer for decoding the next symbol.

25A4. The decode circuit claimed in claim 25A wherein said data stream decoder includes a bit stream decoder.

25B. The decode circuit claimed in claim 25 wherein said inverse scanner is operable to thereby populate the block with residual coefficients.

25C. The decode circuit claimed in claim 25 further comprising a summing circuit, an image inverse-transform-based circuit fed by said inverse scanner and supplying a first input of said summing circuit, and an image prediction circuit coupled to another input of said summing circuit, whereby a decoded image is obtainable from said summing circuit.

29A. The decode circuit claimed in claim 29 wherein said selection circuit is responsive to at least a current one of the Level values to supply a selection signal to select VLC table information to feed into said Run-Level decoder.

29B. The decode circuit claimed in claim 29 wherein said selection circuit is previously initialized to supply an initial selection signal to select initial VLC table information to feed into said Run-Level decoder.

31A. The decoding process claimed in claim 31 wherein all cells in a block of residual block storage are previously initialized with zeroes before inverse-scanning the block.

31A1. The decoding process claimed in claim 31A wherein run cells between coefficient cells remain initialized with zeroes in the block and are skipped over, whereby automatically constituting zero-valued entries.

32A. The decoding process claimed in claim 32 wherein the decoding performance is one coefficient per clock.

38A. The electronic system claimed in claim 38 further comprising a camera circuit to deliver an image signal, an image encoder operable to encode the image signal, said modem operable to send a second transmission responsive to said encoder.

Notes: Aspects are paragraphs which might be offered as claims in patent prosecution. The above dependently-written Aspects have leading digits and internal dependency designations to indicate the claims or aspects to which they pertain. Aspects having no internal dependency designations have leading digits and alphanumerics to indicate the position in the ordering of claims at which they might be situated if offered as claims in prosecution.

Processing circuitry comprehends digital, analog and mixed signal (digital/analog) integrated circuits, ASIC circuits, PALs, PLAs, decoders, memories, and programmable and nonprogrammable processors, microcontrollers and other circuitry. Internal and external couplings and connections can be ohmic, capacitive, inductive, photonic, and direct or indirect via intervening circuits or otherwise as desirable. Process diagrams herein are representative of flow diagrams for operations of any embodiments whether of hardware, software, or firmware, and processes of manufacture thereof. Flow diagrams and block diagrams are each interpretable as representing structure and/or process. While this invention has been described with reference to illustrative embodiments, this description is not to be construed in a limiting sense. Various modifications and combinations of the illustrative embodiments, as well as other embodiments of the invention may be made. The terms "including", "includes", "having", "has", "with", or variants thereof are used in the detailed description and/or the claims to denote non-exhaustive inclusion in a manner similar to the term "comprising". The appended claims and their equivalents cover any such embodiments, modifications, and embodiments as fall within the scope of the invention.

What is claimed is:

1. A block encode circuit for use with information from multiple coding tables corresponding to different respective values of Level, comprising:
   a scanner operable to scan a block having data values spaced apart in the block by run-lengths to produce a succession of pairs of values of Level and Run representing each data value and run-length, and in which the Level values include one or more AC values succeeded by a DC value in the succession; and
   a Run-Level encoder responsive to said scanner to encode the values of Level and Run in a same AC to DC order as in the succession of pairs of values from the scanner to deliver an encoded output, the Run-Level encoder including a memory space for only a single such coding table of the multiple coding tables at a time in response to a current Level to be encoded, and further including a symbol encoder to encode the succession of pairs of values, the symbol encoder coupled to directly access only the memory space to obtain coding table information, so that coding table memory space is reduced.

2. The block encode circuit claimed in claim 1 including a store for a plurality of different coding tables, and a selection circuit operable to supply a selection signal to the store to deliver a single applicable coding table at a time to the memory space.

3. The block encode circuit claimed in claim 2 in which the store is a re-usable store selected from the group consisting of 1) cache, and 2) random access memory (RAM), so that the memory space for the single coding table saves overall space for the block encode circuit.

4. The block encode circuit claimed in claim 1 including a selection circuit responsive to at least one such value from the scanner to select information to feed into the Run-Level encoder.

5. The block encode circuit claimed in claim 4 in which the selection circuit is fed unbuffered from the scanner, so that operations of said Run-Level encoder are at least partially parallelized with said scanner.

6. The block encode circuit claimed in claim 1 including a buffer for holding the block, the scanner including a read counter to read the buffer in an AC to DC order to deliver each read datum, the scanner having a level register and further including a level detector to register a read datum that is a Level value to the level register, and the scanner further including a run counter responsive to the level detector to then count up a Run value until the level detector encounters a next Level value, the level detector coupled to actuate the Run-Level encoder.

7. The block encode circuit claimed in claim 6 in which the level detector is responsive to the DC coefficient to hold the run counter inactive and to assert a DC encode enable to the Run-Level encoder.

8. The block encode circuit claimed in claim 1 including a subtraction circuit, a frame buffer coupled to feed an image frame to an input of the subtraction circuit, an image prediction circuit coupled to another input of the subtraction circuit, and an image transform-based circuit fed by the subtraction circuit to produce the block of data values.

* * * * *